(12) United States Patent
Tanaka et al.

(10) Patent No.: US 8,343,858 B2
(45) Date of Patent: Jan. 1, 2013

(54) METHOD FOR MANUFACTURING MICROCRYSTALLINE SEMICONDUCTOR FILM AND METHOD FOR MANUFACTURING SEMICONDUCTOR DEVICE

(75) Inventors: Tetsuhiro Tanaka, Isehara (JP); Tomokazu Yokoi, Atsugi (JP); Koji Dairiki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/035,037

(22) Filed: Feb. 25, 2011

(65) Prior Publication Data
US 2011/0217811 A1 Sep. 8, 2011

(30) Foreign Application Priority Data
Mar. 2, 2010 (JP) ................................. 2010-045990

(51) Int. Cl.
*H01L 21/20* (2006.01)
*H01L 21/36* (2006.01)
(52) U.S. Cl. .................... 438/488; 438/503; 438/507
(58) Field of Classification Search .................. None
See application file for complete search history.

(56) References Cited

U.S. PATENT DOCUMENTS

| | | |
|---|---|---|
| 2,968,866 A | 1/1961 | Soper et al. |
| 4,251,287 A | 2/1981 | Dalal |
| 4,345,248 A | 8/1982 | Togashi et al. |
| 4,409,134 A | 10/1983 | Yamazaki |
| 4,727,044 A | 2/1988 | Yamazaki |
| 4,859,553 A | 8/1989 | Jansen et al. |
| RE34,658 E | 7/1994 | Yamazaki et al. |
| 5,453,858 A | 9/1995 | Yamazaki |
| 5,514,879 A | 5/1996 | Yamazaki |
| 5,614,732 A | 3/1997 | Yamazaki |
| 5,701,167 A | 12/1997 | Yamazaki |
| 5,766,989 A | 6/1998 | Maegawa et al. |
| 5,843,225 A | 12/1998 | Takayama et al. |
| 5,849,601 A | 12/1998 | Yamazaki |
| 5,854,123 A * | 12/1998 | Sato et al. ................... 438/507 |
| 5,859,445 A | 1/1999 | Yamazaki |

(Continued)

FOREIGN PATENT DOCUMENTS
EP 1505174 A 2/2005
(Continued)

OTHER PUBLICATIONS

Arai.T et al., "41.2: Micro Silicon Technology for Active Matrix Oled Display,", SID Digest '07: SID International Symposium Digest of Technical Papers, 2007, vol. 38, pp. 1370-1373.

(Continued)

*Primary Examiner* — Scott B Geyer
(74) *Attorney, Agent, or Firm* — Eric J. Robinson; Robinson Intellectual Property Law Office, P.C.

(57) ABSTRACT

A method for manufacturing a microcrystalline semiconductor film having high crystallinity is provided. A method for manufacturing a semiconductor device which has favorable electric characteristics with high productivity is provided. After a first microcrystalline semiconductor film is formed over a substrate, treatment for flattening a surface of the first microcrystalline semiconductor film is performed. Then, treatment for removing an amorphous semiconductor region on a surface side of the flattened first microcrystalline semiconductor film is performed so that a second microcrystalline semiconductor film having high crystallinity and flatness is formed. After that, a third microcrystalline semiconductor film is formed over the second microcrystalline semiconductor film.

12 Claims, 15 Drawing Sheets

U.S. PATENT DOCUMENTS

| | | | |
|---|---|---|---|
| 5,932,302 | A | 8/1999 | Yamazaki et al. |
| 6,011,277 | A | 1/2000 | Yamazaki |
| 6,023,075 | A | 2/2000 | Yamazaki |
| 6,171,674 | B1 | 1/2001 | Yamazaki et al. |
| 6,183,816 | B1 | 2/2001 | Yamazaki et al. |
| 6,218,702 | B1 | 4/2001 | Yamazaki et al. |
| 6,252,249 | B1 | 6/2001 | Yamazaki |
| 6,281,520 | B1 | 8/2001 | Yamazaki |
| 6,306,213 | B1 | 10/2001 | Yamazaki |
| 6,410,372 | B2 | 6/2002 | Flewitt |
| 6,468,617 | B1 | 10/2002 | Yamazaki et al. |
| 6,483,124 | B2 | 11/2002 | Flewitt |
| 6,589,822 | B1 | 7/2003 | Yamazaki et al. |
| 6,610,142 | B1 | 8/2003 | Takayama et al. |
| 6,737,676 | B2 | 5/2004 | Yamazaki |
| 6,835,523 | B1 | 12/2004 | Yamazaki et al. |
| 6,855,621 | B2 | 2/2005 | Kondo et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 2003/0162373 | A1 | 8/2003 | Goto et al. |
| 2003/0234369 | A1 | 12/2003 | Glukhoy |
| 2005/0022864 | A1 | 2/2005 | Fujioka et al. |
| 2005/0089648 | A1 | 4/2005 | Yamazaki et al. |
| 2005/0205880 | A1 | 9/2005 | Anzai et al. |
| 2006/0119554 | A1 | 6/2006 | Kawae |
| 2006/0238132 | A1 | 10/2006 | Kitamura et al. |
| 2006/0240602 | A1 | 10/2006 | Cabarrocas et al. |
| 2007/0004220 | A1 | 1/2007 | Tran Quoc et al. |
| 2007/0013842 | A1 | 1/2007 | Yang et al. |
| 2007/0018165 | A1 | 1/2007 | Yamazaki |
| 2007/0120189 | A1 * | 5/2007 | Yamazaki et al. ............ 257/347 |
| 2007/0138475 | A1 | 6/2007 | Kitakado et al. |
| 2008/0012076 | A1 | 1/2008 | Yamazaki et al. |
| 2008/0308807 | A1 | 12/2008 | Yamazaki et al. |
| 2009/0002591 | A1 | 1/2009 | Yamazaki et al. |
| 2009/0023236 | A1 | 1/2009 | Miyairi et al. |
| 2009/0026453 | A1 | 1/2009 | Yamazaki |
| 2009/0072237 | A1 | 3/2009 | Yamazaki et al. |
| 2009/0139447 | A1 | 6/2009 | Toriumi |
| 2009/0142909 | A1 | 6/2009 | Jinbo et al. |
| 2011/0215332 | A1 | 9/2011 | Toriumi |

FOREIGN PATENT DOCUMENTS

| | | | |
|---|---|---|---|
| JP | 62-062073 B | 12/1987 | |
| JP | 02-053941 B | 11/1990 | |
| JP | 04-242724 A | 8/1992 | |
| JP | 05-129608 A | 5/1993 | |
| JP | 07-131030 A | 5/1995 | |
| JP | 07-162003 A | 6/1995 | |
| JP | 10-270706 A | 10/1998 | |
| JP | 11-121761 A | 4/1999 | |
| JP | 2000-277439 A | 10/2000 | |
| JP | 2001-053283 A | 2/2001 | |
| JP | 2002-206168 A | 7/2002 | |
| JP | 2002-299235 A | 10/2002 | |
| JP | 2004-014958 A | 1/2004 | |
| JP | 2005-049832 A | 2/2005 | |
| JP | 2005-050905 A | 2/2005 | |
| JP | 2005-167051 A | 6/2005 | |
| JP | 2005-191546 A | 7/2005 | |
| JP | 2007-005705 A | 1/2007 | |
| JP | 2007-048982 A | 2/2007 | |
| JP | 2007-220816 A | 8/2007 | |
| JP | 2009-044134 A | 2/2009 | |
| JP | 2009-055011 A | 3/2009 | |
| JP | 2009-158950 A | 7/2009 | |

OTHER PUBLICATIONS

Lee.H et al., "Leakage Current Mechanisms in Top-Gate Nanocrystalline Silicon Thin-Film Transistors,", Appl. Phys. Lett. (Applied Physics Letters), Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements,", Appl. Phys. Lett. (Applied Physics Letters), Sep. 12, 2007, vol. 91, No. 11, pp. 113511-1-113511-3.

Lee.C et al., "Stability of NC-SI:H TFTS With Silicon Nitride Gate Dielectric,", IEEE Transactions on Electron Devices, 2007, vol. 54, No. 1, pp. 45-51.

Sazonov.A et al., "Low-Temperature Materials and Thin Film Transistors for Flexible Electronics,", Proceedings of the IEEE, Aug. 1, 2005, vol. 93, No. 8, pp. 1420-1428.

Esmaeili-Rad.M et al., "Stability of Nanocrystalline Silicon Bottom-Gate Thin Film Transistors With Silicon Nitride Gate Dielectric,", J. Appl. Phys. (Journal of Applied Physics), Sep. 28, 2007, vol. 102, No. 6, pp. 064512-1-064512-7.

Lee.C et al., "Top-Gate TFTS Using 13.56MHZ PECVD Microcrystalline Silicon,", IEEE Electron Device Letters, Sep. 5, 2005, vol. 26, No. 9, pp. 637-639.

Lee.C et al, "Postdeposition Thermal Annealing and Material Stability of 75 °C Hydrogenated Nanocrystalline Silicon Plasma-Enhanced Chemical Vapor Deposition Films,", J. Appl. Phys. (Journal of Applied Physics), Aug. 4, 2005, vol. 98, No. 3, pp. 034305-1-034405-7.

Srinivasan.E et al., "Hydrogen Elimination and Phase Transitions in Pulsed-Gas Plasma Deposition of Amorphous and Microcrystalline Silicon,", J. Appl. Phys. (Journal of Applied Physics), Mar. 15, 1997, vol. 81, No. 6, pp. 2847-2855.

* cited by examiner

METHOD FOR MANUFACTURING MICROCRYSTALLINE SEMICONDUCTOR FILM AND METHOD FOR MANUFACTURING SEMICONDUCTOR DEVICE

BACKGROUND OF THE INVENTION

1. Field of the Invention

The present invention relates to a method for manufacturing a microcrystalline semiconductor film and a method for manufacturing a semiconductor device which uses the microcrystalline semiconductor film.

In this specification, a semiconductor device means all types of devices which can function by utilizing semiconductor characteristics, and a display device, an electro-optical device, a photoelectric conversion device, a semiconductor circuit, and an electronic device are all semiconductor devices.

2. Description of the Related Art

As one type of field-effect transistor, a thin film transistor whose channel region is formed using a semiconductor film that is formed over a substrate having an insulating surface is known. Techniques in which amorphous silicon, microcrystalline silicon, or polycrystalline silicon is used for a semiconductor film used for a channel region of a thin film transistor have been disclosed (see Patent Documents 1 to 5). A typical application of thin film transistors is a liquid crystal television device, in which thin film transistors have been put to practical use as a switching transistor for each pixel that constitutes a display screen.

A photoelectric conversion device is being developed in which microcrystalline silicon, which is crystalline silicon capable of being manufactured by a plasma CVD method, is used in a semiconductor film having a function of photoelectric conversion (for example, see Patent Document 6).

REFERENCE

Patent Document

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546
[Patent Document 6] Japanese Published Patent Application No. 2000-277439

SUMMARY OF THE INVENTION

A thin film transistor in which a channel region is formed using an amorphous silicon film has problems such as low field-effect mobility and low on-state current. On the other hand, a thin film transistor in which a channel region is formed using a microcrystalline silicon film has a problem in that, whereas the field-effect mobility is higher than that of the thin film transistor in which a channel region is formed using an amorphous silicon film, off-state current is high, and thus sufficient switching characteristics cannot be obtained.

The thin film transistor in which a channel region is formed using a polycrystalline silicon film has characteristics in that the field-effect mobility is far higher than those of the above-described two kinds of thin film transistors and high on-state current can be obtained. Because of such characteristics, this thin film transistor can be used not only as a switching transistor provided in a pixel but also in a driver circuit for which high-speed operation is required.

However, a manufacturing process of a thin film transistor in which a channel region is formed using a polycrystalline silicon film needs a crystallization step for a semiconductor film, which leads to a problem of higher manufacturing cost, when compared to a manufacturing process of a thin film transistor in which a channel region is formed using an amorphous silicon film. For example, a laser annealing technique involved in the process for forming a polycrystalline silicon film has a problem in that large-screen liquid crystal panels cannot be produced efficiently because the laser beam irradiation area is small.

A glass substrate for manufacturing display panels has been grown in size from year to year as follows: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), and the 8th generation (2200 mm×2400 mm) From now on, the size of the glass substrate is expected to grow to the 9th generation (2400 mm×2800 mm or 2450 mm×3050 mm) and the 10th generation (2950 mm×3400 mm). The increase in size of the glass substrate is based on the concept of minimum cost design.

On the other hand, a technique with which a thin film transistor capable of high-speed operation can be manufactured with high productivity over a large-area mother glass substrate like the 10th generation (2950 mm×3400 mm) mother glass substrate has not been established yet, which is a problem in industry.

An object of one embodiment of the present invention is to provide a method for manufacturing a microcrystalline semiconductor film having high crystallinity. Another object of one embodiment of the present invention is to provide a method for manufacturing a semiconductor device which has favorable electric characteristics with high productivity.

In one embodiment of the present invention, a first microcrystalline semiconductor film is formed over a substrate and then treatment for flattening a surface of the first microcrystalline semiconductor film is performed. Then, treatment for removing a superficial layer of the flattened first microcrystalline semiconductor film is performed so that an amorphous semiconductor region formed by the flattening treatment is removed and a second microcrystalline semiconductor film having high crystallinity and flatness is formed. Further, a third microcrystalline semiconductor film is formed over the second microcrystalline semiconductor film.

The treatment for flattening the surface of the first microcrystalline semiconductor film is treatment for exposing the first microcrystalline semiconductor film to plasma generated in a rare gas (helium, neon, argon, krypton, or xenon) atmosphere. In plasma generated in a rare gas atmosphere, rare gas ions are contained. When the rare gas ions collide with the first microcrystalline semiconductor film, a projected portion of the first microcrystalline semiconductor film can be etched and a space between crystal grains of the first microcrystalline semiconductor film can be filled with the microcrystalline semiconductor. An area occupied by the space between the crystal grains is made extremely small in this step.

However, an amorphous semiconductor region is formed on the surface side of the flattened first microcrystalline semiconductor film by the collision of the rare gas ions which are generated in the atmosphere of a rare gas such as helium, neon, argon, or krypton. Therefore, when the amorphous semiconductor region on the surface side of the flattened first microcrystalline semiconductor film is removed, the second microcrystalline semiconductor film having high crystallinity and flatness in which the number and size of spaces between crystal grains are extremely small can be formed. When the flattened first microcrystalline semiconductor film is exposed to plasma generated in an atmosphere containing hydrogen, the amorphous semiconductor region on the surface side of the flattened first microcrystalline semiconductor film can be removed. The etching rate of an amorphous semiconductor is higher than that of a microcrystalline semiconductor when plasma generated in an atmosphere containing hydrogen is used for etching; thus, the amorphous semiconductor region on the surface side of the flattened first microcrystalline semiconductor film can be selectively etched. An atmosphere containing hydrogen means a hydrogen atmosphere or a mixed atmosphere containing hydrogen and an inert gas (e.g., a rare gas).

The third microcrystalline semiconductor film grows using the second microcrystalline semiconductor film having high crystallinity and flatness in which the number of the spaces between the crystal grains is extremely small as a seed crystal. Thus, the third microcrystalline semiconductor film having high crystallinity in which the number of spaces between crystal grains is extremely small can be formed.

Another embodiment of the present invention is a method for manufacturing a semiconductor device including a thin film transistor whose channel region is formed using the stacked first to third microcrystalline semiconductor films.

Another embodiment of the present invention is a method for manufacturing a photoelectric conversion device in which the stacked first to third microcrystalline semiconductor films is used as at least one of a semiconductor film having a p-type conductivity, a semiconductor film having an n-type conductivity, and a semiconductor film having a function of photoelectric conversion.

A microcrystalline semiconductor film which has high crystallinity and high flatness can be formed. Moreover, a semiconductor device which has favorable electric characteristics can be manufactured with high productivity.

DETAILED DESCRIPTION OF THE INVENTION

Figure 1A:
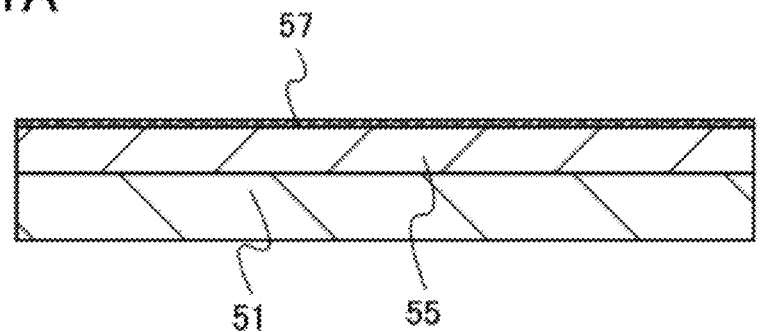
FIGS. 1A to 1D are cross-sectional views illustrating a method for manufacturing a microcrystalline semiconductor film according to one embodiment of the present invention.

Hereinafter, embodiments of the present invention are described with reference to the drawings. However, the present invention is not limited to the following description. It is easily understood by those skilled in the art that the mode and detail can be variously changed unless departing from the scope and spirit of the present invention. Therefore, the present invention is not construed as being limited to the following description of the embodiments and examples. Note that reference numerals denoting the same portions are commonly used in different drawings.

Note that the size, the thickness of a layer, and a region of each structure illustrated in the drawings and the like in the embodiments are exaggerated for simplicity in some cases. Therefore, embodiments of the present invention are not limited to such scales.

Note that terms with ordinal numbers such as "first", "second", and "third" in this specification are used in order to identify components and the terms do not limit the number or order of the components.

Embodiment 1

In this embodiment, a method for manufacturing a microcrystalline semiconductor film having high crystallinity and high flatness in which an area occupied by a space between crystal grains is small is described with reference to FIGS. 1A to 1D and FIGS. 2A to 2D.

As illustrated in FIG. 1A, an insulating film 55 is formed over a substrate 51 and a first microcrystalline semiconductor film 57 is formed over the insulating film 55.

As the substrate 51, a glass substrate; a ceramic substrate; a plastic substrate which has high heat resistance enough to withstand a process temperature of this manufacturing process; or the like can be used. In the case where the substrate does not need a light-transmitting property, a metal substrate, such as a stainless steel alloy substrate, provided with an insulating film on its surface may be used. As the glass substrate, for example, an alkali-free glass substrate of barium borosilicate glass, aluminoborosilicate glass, aluminosilicate glass, or the like may be used. Note that there is no limitation on the size of the substrate 51. For example, any of a glass substrates of the 3rd to 10th generations which is often used in the field of the above flat panel display can be used.

The insulating film 55 can be formed as a single layer or a stacked layer using one or more of a silicon oxide film, a silicon nitride film, a silicon oxynitride film, a silicon nitride oxide film, an aluminum nitride film, an aluminum oxide film, an aluminum oxynitride film, a hafnium oxide film, a hafnium oxynitride film, and the like by a CVD method, a sputtering method, or the like.

The silicon oxynitride means silicon that contains more oxygen than nitrogen, and preferably contains, when measured using Rutherford backscattering spectrometry (RBS) and hydrogen forward scattering (HFS), oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, the silicon nitride oxide means silicon that contains more nitrogen than oxygen, and preferably contains, when measured using RBS and HFS, oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of contained nitrogen, oxygen, silicon, and hydrogen fall within the ranges given above, where the total number of atoms contained in the silicon oxynitride or the silicon nitride oxide is defined as 100 at. %.

Note that the insulating film 55 is not necessarily formed.

The first microcrystalline semiconductor film 57 is formed using a microcrystalline semiconductor film, typically a microcrystalline silicon film, a microcrystalline silicon-germanium film, a microcrystalline germanium film, or the like. As the first microcrystalline semiconductor film 57, a microcrystalline semiconductor film having high crystallinity is preferably formed. Further, the size of crystal grain can be larger by forming a microcrystalline semiconductor film in which the surface density of the crystal grain is low. Therefore, in the first microcrystalline semiconductor film 57, in some cases, the crystal grains are not in contact with each other and have a space therebetween. The thickness of the first microcrystalline semiconductor film 57 is preferably greater than or equal to 1 nm and less than or equal to 10 nm Note that the crystal grain includes an amorphous semiconductor region and a crystallite which is a minute crystal that can be regarded as a single crystal.

The first microcrystalline semiconductor film 57 is formed in a treatment chamber of a plasma CVD apparatus by glow discharge plasma with the use of a mixture of a deposition gas containing silicon or germanium and hydrogen under such a condition that the crystallinity of the crystal grain is improved. Alternatively, the first microcrystalline semiconductor film 57 is formed by glow discharge plasma with the use of a mixture of a deposition gas containing silicon or germanium, hydrogen, and a rare gas such as helium, neon, or krypton. Here, microcrystalline silicon, microcrystalline silicon-germanium, microcrystalline germanium, or the like is formed under a condition that the deposition gas containing silicon or germanium is diluted with hydrogen whose flow rate is greater than or equal to 50 times and less than or equal to 1000 times that of the deposition gas. The deposition temperature in that case is preferably room temperature to 300° C., further preferably 150° C. to 280° C. Note that a gap between an upper electrode and a lower electrode may be a gap which allows generation of plasma.

As typical examples of the deposition gas containing silicon or germanium, $SiH_4$, $Si_2H_6$, $GeH_4$, and $Ge_2H_6$ are given.

Note that when a silicon nitride film is formed as the insulating film 55, an amorphous semiconductor is likely to be formed in the initial period of the deposition of the first microcrystalline semiconductor film 57, which leads to low crystallinity of the first microcrystalline semiconductor film 57. Therefore, a low temperature condition in which the temperature for the deposition of the first microcrystalline semiconductor film 57 is 150° C. to 250° C. is preferable. When the low temperature condition is employed, initial nucleation density of the first microcrystalline semiconductor film 57 is increased and an amorphous semiconductor is not likely to be formed over the insulating film 55; thus, the crystallinity of the first microcrystalline semiconductor film 57 is improved. Furthermore, when a surface of the insulating film 55 formed using a silicon nitride film is subjected to oxidation treatment, the adhesion with the first microcrystalline semiconductor film 57 is improved. As the oxidation treatment, exposure to an oxidizing gas, plasma treatment in an oxidizing gas, or the like can be given. Examples of the oxidizing gas include oxygen, ozone, dinitrogen monoxide, water vapor, a mixed gas of oxygen and hydrogen, and the like.

Figure 2A:
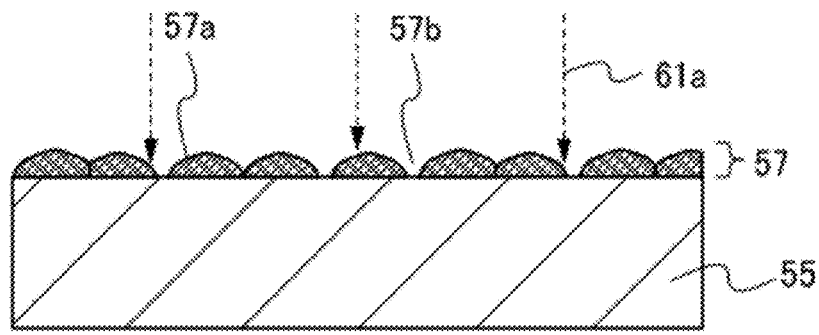
FIGS. 2A to 2D are cross-sectional views illustrating a method for manufacturing a microcrystalline semiconductor film according to one embodiment of the present invention.

A rare gas (helium, argon, neon, krypton, or xenon) is used in a source gas of the first microcrystalline semiconductor film 57, whereby the deposition rate of the first microcrystalline semiconductor film 57 can be increased. When the deposition rate is increased, the amount of impurities mixed into the first microcrystalline semiconductor film 57 can be reduced, whereby the crystallinity of the first microcrystalline semiconductor film 57 can be improved. Note that in FIG. 1A, although the first microcrystalline semiconductor film 57 is illustrated as a flattened film, the first microcrystalline semiconductor film 57 has a depressed portion and a projected portion in many cases as illustrated in FIG. 2A when the crystallinity is improved.

When the first microcrystalline semiconductor film 57 is formed, glow discharge plasma is generated by applying high-frequency power with a frequency of 3 MHz to 30 MHz, typically, 13.56 MHz or 27.12 MHz in the HF band, or high-frequency power with a frequency of approximately 30 MHz to 300 MHz in the VHF band, typically 60 MHz. Alternatively, glow discharge plasma is generated by applying high-frequency power at a microwave frequency of 1 GHz or more. Note that a pulsed oscillation by which high-frequency power is applied in a pulsed manner or a continuous oscillation by which high-frequency power is applied continuously may be applied. In addition, by superimposing high-frequency power in the HF band and high-frequency power in the VHF band on each other, unevenness of plasma in a large-sized substrate is also reduced, so that uniformity can be improved and the deposition rate can be increased.

Note that before the first microcrystalline semiconductor film 57 is formed, a deposition gas containing silicon or germanium is introduced into the treatment chamber while a gas in the treatment chamber of the CVD apparatus is removed so that impurity elements in the treatment chamber are removed, in which case the amount of the impurity elements in the first microcrystalline semiconductor film 57 can be reduced. Further, before the first microcrystalline semiconductor film 57 is formed, plasma may be generated in an atmosphere containing fluorine such as a fluorine atmosphere, a nitrogen fluoride atmosphere, or a silane fluoride atmosphere and the insulating film 55 may be exposed to the plasma.

Figure 1B:
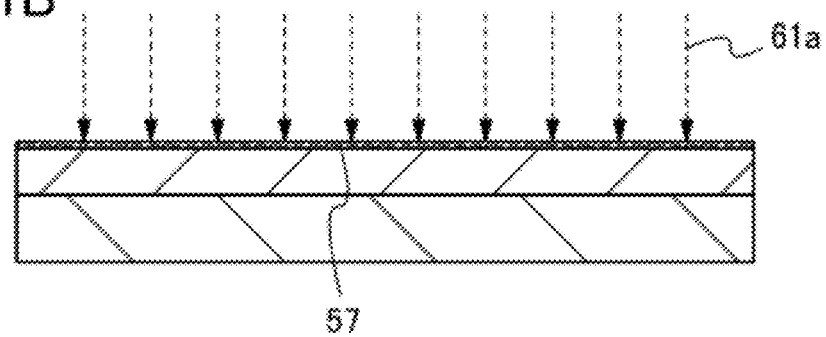

After that, as illustrated in FIG. 1B, treatment for flattening the first microcrystalline semiconductor film 57 is performed. Here, the first microcrystalline semiconductor film 57 is exposed to plasma 61a which is generated in an atmosphere of a rare gas such as helium, neon, argon, or krypton. The plasma 61a which is generated in an atmosphere of a rare gas such as helium, neon, argon, or krypton does not react with the first microcrystalline semiconductor film 57. Therefore, helium ions, neon ions, argon ions, krypton ions, or the like contained in the plasma 61a which is generated in an atmosphere of a rare gas such as helium, neon, argon, or krypton collide with the first microcrystalline semiconductor film 57 and the projected portion of the first microcrystalline semiconductor film 57 is physically etched. Moreover, the space between the crystal grains of the first microcrystalline semiconductor film 57 can be filled with the microcrystalline semiconductor which has been etched so that a flattened second microcrystalline semiconductor film 58 can be formed. The second microcrystalline semiconductor film 58 is preferably a microcrystalline semiconductor film having flatness in which the number and size of spaces between crystal grains are extremely small, thereby preventing a solution (e.g., hydrofluoric acid) from permeating. Note that in this step, by exposing the first microcrystalline semiconductor film 57 to the plasma 61a which is generated in an atmosphere of a rare gas such as helium, neon, argon, or krypton, a surface side of the second microcrystalline semiconductor film 58 is made amorphous owing to damage by the ions.

The condition used for the deposition of the first microcrystalline semiconductor film 57 can be appropriately employed to generate the glow discharge plasma 61a in an atmosphere of a rare gas such as helium, neon, argon, or krypton.

Figure 1C:
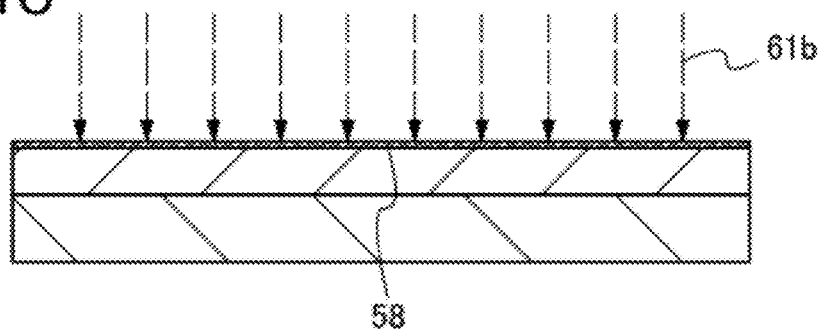
Figure 1D:
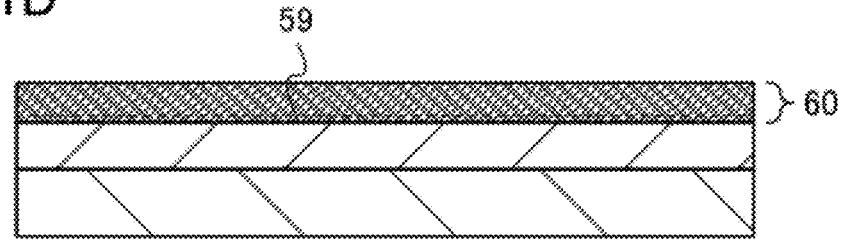

Next, as illustrated in FIG. 1C, treatment for removing the amorphous semiconductor region on the surface side of the flattened second microcrystalline semiconductor film 58 is performed. Here, the second microcrystalline semiconductor film 58 is exposed to plasma 61b which is generated in an atmosphere containing hydrogen. An amorphous semiconductor is more easily etched than a microcrystalline semiconductor by plasma generated in an atmosphere containing hydrogen; thus, the amorphous semiconductor region on the surface side of the flattened second microcrystalline semiconductor film can be selectively etched. Thus, a third microcrystalline semiconductor film 59 having high crystallinity and flatness in which an area occupied by a space between crystal grains is small can be formed (see FIG. 1D).

The condition used for the deposition of the first microcrystalline semiconductor film 57 can be appropriately employed to generate the glow discharge plasma 61b in an atmosphere containing hydrogen.

Then, a fourth microcrystalline semiconductor film 60 is formed over the third microcrystalline semiconductor film 59 having high crystallinity and flatness in which the number and size of the spaces between the crystal grains are extremely small. The fourth microcrystalline semiconductor film 60 grows using the third microcrystalline semiconductor film 59 having high crystallinity and flatness in which the number and size of the spaces between the crystal grains are extremely small as a seed crystal. Since the area occupied by the space between the crystal grains is small in the third microcrystalline semiconductor film 59, an area occupied by a space between crystal grains included in the fourth microcrystalline semiconductor film 60 can be small and the crystallinity can be improved.

The fourth microcrystalline semiconductor film 60 is formed in a treatment chamber of a plasma CVD apparatus by glow discharge plasma with the use of a mixture of a deposition gas containing silicon or germanium and hydrogen. Alternatively, the fourth microcrystalline semiconductor film 60 is formed by glow discharge plasma with the use of a mixture of a deposition gas containing silicon or germanium, hydrogen, and a rare gas. Here, microcrystalline silicon, microcrystalline silicon-germanium, microcrystalline germanium, or the like is formed under a condition that the deposition gas containing silicon or germanium is diluted with hydrogen whose flow rate is greater than or equal to 50 times and less than or equal to 1000 times that of the deposition gas. The deposition temperature in that case is preferably room temperature to 300° C., further preferably 150° C. to 280° C. Note that a gap between an upper electrode and a lower electrode may be a gap which allows generation of plasma.

By using a rare gas in a source gas of the fourth microcrystalline semiconductor film 60, similarly to the first microcrystalline semiconductor film 57, the crystallinity of the fourth microcrystalline semiconductor film 60 can be improved.

The condition used for the deposition of the first microcrystalline semiconductor film 57 can be appropriately employed to generate the glow discharge plasma for the formation of the fourth microcrystalline semiconductor film 60. Note that the glow discharge plasma for the formation of the first microcrystalline semiconductor film 57 and that for the formation of the fourth microcrystalline semiconductor film 60 may be generated under the same condition, in which case the throughput can be improved, or under different conditions.

Formation of the first microcrystalline semiconductor film 57, the second microcrystalline semiconductor film 58, the third microcrystalline semiconductor film 59, and the fourth microcrystalline semiconductor film 60 is more specifically described with reference to FIGS. 2A to 2D.

FIG. 2A is an enlarged view of the first microcrystalline semiconductor film 57. The first microcrystalline semiconductor film 57 is formed under such a condition that the crystallinity of the crystal grain is improved. Typically, the deposition gas containing silicon or germanium is diluted with hydrogen whose flow rate is greater than or equal to 50 times and less than or equal to 1000 times that of the deposition gas. The flow rate of hydrogen is higher than that of the deposition gas containing silicon or germanium as described above, whereby the amorphous semiconductor contained in the first microcrystalline semiconductor film 57 is etched at the same time as the deposition of the first microcrystalline semiconductor film 57. As a result, a crystal grain 57a having high crystallinity is formed; however, a space 57b is formed because an amorphous semiconductor between the crystal grains 57a is etched. In addition, when surface roughness of the crystal grain 57a is increased by an increase in the grain size of the crystal grain 57a, probability that a deposition precursor enters the space 57b between the crystal grains 57a is low and the space 57b between the crystal grains 57a is not filled with the microcrystalline semiconductor. When the crystallinity of the crystal grain is high, the crystallinity of the first microcrystalline semiconductor film 57 becomes high. For the above reason, transfer of carriers is interfered because of the space 57b and the electric characteristics of a thin film transistor are not improved even when the thin film transistor is formed using the microcrystalline semiconductor film having high crystallinity which is described above.

In view of the above, the first microcrystalline semiconductor film 57 having the depressed portion and the projected portion is exposed to the plasma 61a which is generated in an atmosphere of a rare gas such as helium, neon, argon, or krypton. The plasma 61a which is generated in an atmosphere of a rare gas such as helium, neon, argon, or krypton does not react with the first microcrystalline semiconductor film.

Figure 2B:
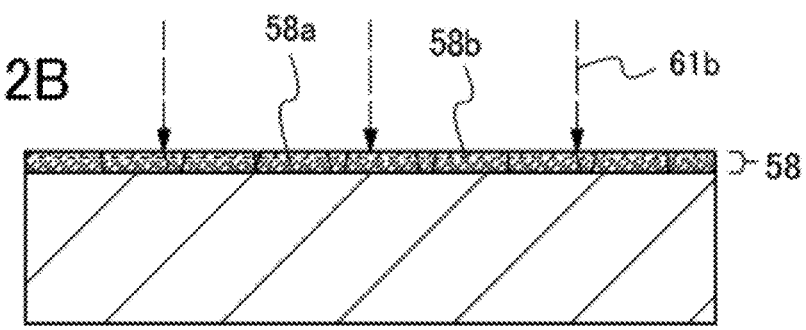
Figure 2C:
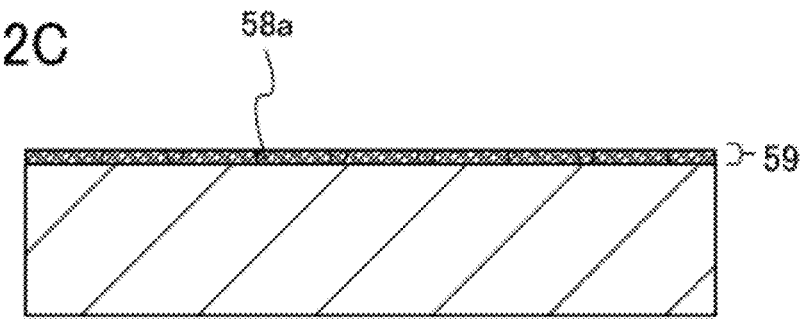

Thus, helium ions, neon ions, argon ions, krypton ions, or the like contained in the plasma 61a which is generated in an atmosphere of a rare gas such as helium, neon, argon, or krypton physically collide with the crystal grain 57a of the first microcrystalline semiconductor film 57 and the projected portion of the crystal grain 57a is selectively etched; moreover, the space 57b between the crystal grains 57a subjected to etching is filled with the microcrystalline semiconductor which has been etched. As a result, the flattened second microcrystalline semiconductor film 58 can be formed as illustrated in FIG. 2B. Note that in this step, by exposing the first microcrystalline semiconductor film 57 to the plasma 61a which is generated in an atmosphere of a rare gas such as helium, neon, argon, or krypton, the surface side of the crystal grain is damaged by the ions and an amorphous semiconductor region 58b is formed on a crystal grain 58a.

Therefore, the amorphous semiconductor region 58b on the surface side of the second microcrystalline semiconductor film 58 is removed. In this embodiment, the second microcrystalline semiconductor film 58 is exposed to the plasma 61b which is generated in an atmosphere containing hydrogen. The etching rate of an amorphous semiconductor is higher than that of a microcrystalline semiconductor when the plasma 61b generated in an atmosphere containing hydrogen is used for etching; thus, the amorphous semiconductor region 58b on the surface side of the flattened second microcrystalline semiconductor film 58 can be selectively etched and the crystal grain 58a can be left. Thus, the third microcrystalline semiconductor film 59 having high crystallinity and flatness in which the area occupied by the space between the crystal grains is small can be formed (see FIG. 2C).

Figure 2D:
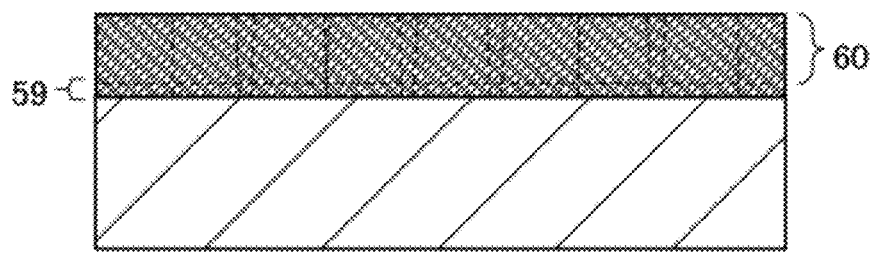

Then, as illustrated in FIG. 2D, the fourth microcrystalline semiconductor film 60 is formed over the third microcrystalline semiconductor film 59. The fourth microcrystalline semiconductor film 60 grows using the third microcrystalline semiconductor film 59 having high crystallinity and flatness in which the area occupied by the space between the crystal grains is small as a seed crystal. Since the area occupied by the space between the crystal grains is small in the third microcrystalline semiconductor film 59, the area occupied by the space between the crystal grains included in the fourth microcrystalline semiconductor film 60 can be small and the crystallinity can be improved.

In this embodiment, a microcrystalline semiconductor film having high crystallinity and flatness in which an area occupied by a space between crystal grains is small can be formed in the following manner: a microcrystalline semiconductor film is formed; a step of flattening the microcrystalline semiconductor film and a step of improving its crystallinity are performed; and then, a microcrystalline semiconductor film is stacked thereover.

The first microcrystalline semiconductor film 57, the third microcrystalline semiconductor film 59, and the fourth microcrystalline semiconductor film 60 contain a microcrystalline semiconductor. Note that a microcrystalline semiconductor is a semiconductor having an intermediate structure between amorphous and crystalline structures (including single crystal and polycrystal). A microcrystalline semiconductor is a semiconductor having a third state that is stable in terms of free energy and a crystalline semiconductor having short-range order and lattice distortion, in which columnar crystals or needle-like crystals having a grain size greater than or equal to 2 nm and less than or equal to 200 nm, preferably greater than or equal to 10 nm and less than or equal to 80 nm, further preferably greater than or equal to 20 nm and less than or equal to 50 nm have grown in a direction normal to the substrate surface. Therefore, a crystal grain boundary is formed at the interface between the columnar crystals or needle-like crystals in some cases.

A peak of the Raman spectrum of microcrystalline silicon, which is a typical example of a microcrystalline semiconductor, is shifted in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents a peak of the Raman spectrum of single crystal silicon and 480 cm$^{-1}$ which represents a peak of the Raman spectrum of amorphous silicon. The microcrystalline semiconductor contains at least 1 at. % or more of hydrogen or halogen to terminate a dangling bond. Moreover, when a microcrystalline semiconductor contains a rare gas element to further promote lattice distortion, stability is increased and a favorable microcrystalline semiconductor can be obtained. Such a microcrystalline semiconductor is disclosed in, for example, U.S. Pat. No. 4,409,134.

According to this embodiment, a microcrystalline semiconductor film having high crystallinity and flatness in which an area occupied by a space between crystal grains is small can be formed.

Embodiment 2

In this embodiment, a method for manufacturing a thin film transistor formed in the semiconductor device that is one embodiment of the present invention is described with reference to FIGS. 3A to 3E, FIGS. 4A and 4B, FIGS. 5A to 5C, and FIGS. 6A to 6D. Note that an n-channel thin film transistor has higher carrier mobility than a p-channel thin film transistor. Further, it is preferable that all thin film transistors formed over one substrate have the same polarity because the number of manufacturing steps can be reduced. Therefore, in this embodiment, a method for manufacturing an n-channel thin film transistor is described.

Note that the term "on-state current" refers to current which flows between a source electrode and a drain electrode when a thin film transistor is on. For example, in the case of an n-channel thin film transistor, the on-state current refers to current which flows between a source electrode and a drain electrode when gate voltage is higher than threshold voltage of the thin film transistor.

In addition, the term "off-state current" refers to current which flows between a source electrode and a drain electrode when a thin film transistor is off. For example, in the case of an n-channel thin film transistor, the on-state current refers to current which flows between a source electrode and a drain electrode when gate voltage is lower than threshold voltage of the thin film transistor.

Figure 3A:
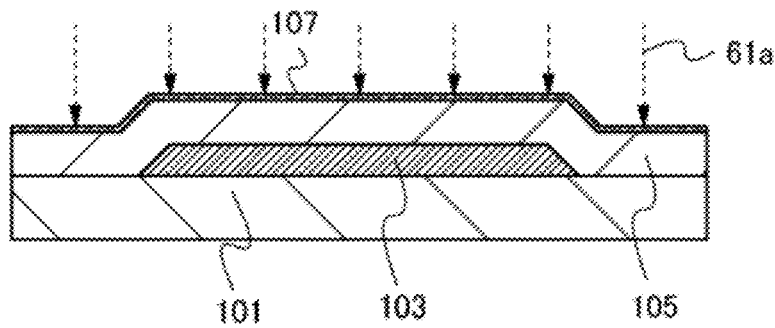
FIGS. 3A to 3E are cross-sectional views illustrating a method for manufacturing a semiconductor device according to one embodiment of the present invention.

As illustrated in FIG. 3A, a gate electrode 103 is formed over a substrate 101. Then, a gate insulating film 105 which covers the gate electrode 103 (also referred to as a first gate electrode) is formed. A first microcrystalline semiconductor film 107 is formed over the gate insulating film 105.

As the substrate 101, the substrate 51 described in Embodiment 1 can be used as appropriate.

The gate electrode 103 can be formed as a single layer or a stacked layer using a metal material such as molybdenum, titanium, chromium, tantalum, tungsten, aluminum, copper, neodymium, scandium, or nickel or an alloy material which contains any of these materials as a main component. A semiconductor typified by polycrystalline silicon doped with an impurity element such as phosphorus, an Ag—Pd—Cu alloy, an Al—Nd alloy, an Al—Ni alloy, or the like may be used.

For example, the following is preferable as a two-layer structure of the gate electrode 103: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, a two-layer structure in which a titanium nitride film and a molybdenum film are stacked, a two-layer structure in which a film of a copper-magnesium alloy containing oxygen and a copper film are stacked, a two-layer structure in which a film of copper-manganese alloy containing oxygen and a copper film are stacked, a two-layer structure in which a copper-manganese alloy film and a copper film are stacked, or the like. As a three-layer structure, it is preferable to stack a tungsten film or a tungsten nitride film, an alloy film of aluminum and silicon or an alloy film of aluminum and titanium, and a titanium nitride film or a titanium film. By stacking a metal film functioning as a barrier film over a film having low electric resistance, electric resistance can be low and diffusion of a metal element from the metal film into the semiconductor film can be prevented.

The gate electrode 103 can be formed in the following manner: a conductive film is formed over the substrate 101 by a sputtering method or a vacuum evaporation method using the above-described material(s); a mask is formed over the conductive film by a photolithography method, an inkjet method, or the like; and the conductive film is etched using the mask. Alternatively, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a film of a nitride of any of the above-described metal materials may be provided between the substrate 101 and the gate electrode 103. In this embodiment, a conductive film is formed over the substrate 101 and etched using a resist mask formed by a photolithography method.

A side surface of the gate electrode 103 is preferably tapered. This is because an insulating film, a semiconductor film, and a wiring formed over the gate electrode 103 can be prevented from being cut in a step portion of the gate electrode 103. In order to taper the side surface of the gate electrode 103, etching may be performed while the resist mask is made to recede.

In the step of forming the gate electrode 103, a gate wiring (a scan line) and a capacitor wiring can also be formed at the same time. The scan line means a wiring for selecting a pixel, while the capacitor wiring means a wiring which is connected to one of electrodes of a storage capacitor in a pixel. However, without limitation thereto, either one or both of the gate wiring and the capacitor wiring may be formed in a separate step from that of the gate electrode 103.

The gate insulating film 105 can be formed using the insulating film 55 described in Embodiment 1 as appropriate. By forming the gate insulating film 105 using silicon oxide or silicon oxynitride, fluctuation in threshold voltage of the thin film transistor can be suppressed.

The gate insulating film 105 can be formed by a CVD method, a sputtering method, or the like. The condition used for the deposition of the first microcrystalline semiconductor film 57 which is described in Embodiment 1 can be appropriately employed to generate the glow discharge plasma in the step for the formation of the gate insulating film 105 by a CVD method. When the gate insulating film 105 is formed at a high frequency (1 GHz or more) using a microwave plasma CVD apparatus, the withstand voltage between the gate electrode and the drain and source electrodes can be improved, so that a highly reliable thin film transistor can be obtained.

Further, by forming a silicon oxide film by a CVD method using an organosilane gas as the gate insulating film 105, the crystallinity of the semiconductor film which is formed later can be improved, so that the on-state current and the field-effect mobility of the thin film transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

Similarly to the first microcrystalline semiconductor film 57 described in Embodiment 1, the first microcrystalline semiconductor film 107 can be formed under such a condition that the crystallinity of the crystal grain is improved.

By using a rare gas in a source gas of the first microcrystalline semiconductor film 107, the crystallinity of the first microcrystalline semiconductor film 107 can be improved. Thus, the on-state current and field-effect mobility of the thin film transistor are increased and throughput of the thin film transistor can also be increased because laser treatment or the like is not included.

Figure 3B:
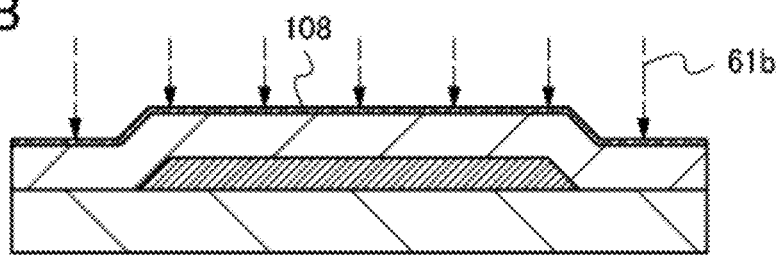

Then, similarly to Embodiment 1, treatment for flattening the first microcrystalline semiconductor film 107 is performed. Here, the first microcrystalline semiconductor film 107 is exposed to the plasma 61a which is generated in a rare gas atmosphere. In this step, a projected portion of the first microcrystalline semiconductor film 107 can be physically etched and a space between the crystal grains is filled with the microcrystalline semiconductor; thus, a flattened second microcrystalline semiconductor film 108 can be formed as illustrated in FIG. 3B. Note that in this step, by exposing the first microcrystalline semiconductor film 107 to the plasma 61a which is generated in an atmosphere of a rare gas such as helium, neon, argon, or krypton, an amorphous semiconductor region is formed on a surface side of the second microcrystalline semiconductor film 108 owing to damage by ions.

Figure 3C:
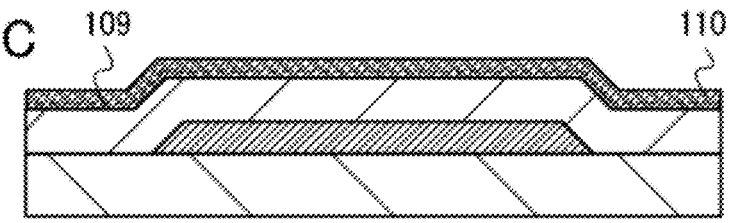

After that, treatment for removing the amorphous semiconductor region formed on the surface side of the flattened second microcrystalline semiconductor film 108 is performed. Here, the second microcrystalline semiconductor film 108 is exposed to the plasma 61b which is generated in an atmosphere containing hydrogen. As a result, a third microcrystalline semiconductor film 109 having high crystallinity and flatness in which an area occupied by a space between crystal grains is small can be formed as illustrated in FIG. 3C.

Then, a fourth microcrystalline semiconductor film 110 is formed over the third microcrystalline semiconductor film 109. The fourth microcrystalline semiconductor film 110 grows using the third microcrystalline semiconductor film 109 having high crystallinity and flatness in which the area occupied by the space between the crystal grains is small as a seed crystal. Thus, an area occupied by a space between crystal grains contained in the fourth microcrystalline semiconductor film 110 can be small and the crystallinity of the crystal grain can be improved.

By using a rare gas in a source gas of the fourth microcrystalline semiconductor film 110, similarly to the first microcrystalline semiconductor film 107, the crystallinity of the fourth microcrystalline semiconductor film 110 can be improved. Thus, the on-state current and field-effect mobility of the thin film transistor are increased and throughput of the thin film transistor can also be increased because laser treatment or the like is not included.

Figure 3D:
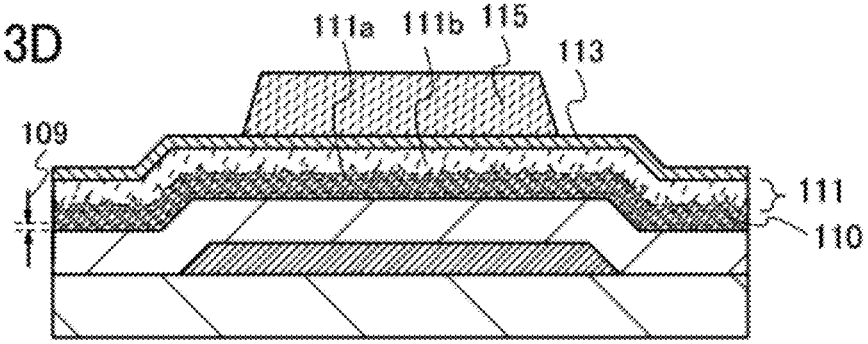
Figure 3E:
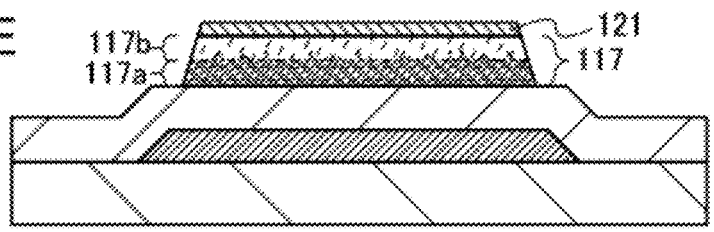

Next, as illustrated in FIG. 3D, a semiconductor film 111 is formed over the fourth microcrystalline semiconductor film 110. The semiconductor film 111 includes a microcrystalline semiconductor region 111a and an amorphous semiconductor region 111b. Next, an impurity semiconductor film 113 is formed over the semiconductor film 111. Then, a resist mask 115 is formed over the impurity semiconductor film 113.

The semiconductor film 111 including the microcrystalline semiconductor region 111a and the amorphous semiconductor region 111b can be formed under such a condition that crystal growth is partly conducted (the crystal growth is partly suppressed) with the use of the fourth microcrystalline semiconductor film 110 as a seed crystal.

The semiconductor film 111 is formed in a treatment chamber of a plasma CVD apparatus by glow discharge plasma with the use of a mixture of a deposition gas containing silicon or germanium, hydrogen and a gas containing nitrogen. Examples of the gas containing nitrogen include ammonia, nitrogen, nitrogen fluoride, nitrogen chloride, chloroamine, fluoroamine, and the like. The glow discharge plasma can be generated as in the case of the first microcrystalline semiconductor film 107.

In that case, the flow ratio of the deposition gas containing silicon or germanium to hydrogen is the same as that for forming a microcrystalline semiconductor film like the first microcrystalline semiconductor film 107 or the fourth microcrystalline semiconductor film 110, and the gas containing nitrogen is used in a source gas, whereby crystal growth can be reduced as compared to either the deposition condition for the first microcrystalline semiconductor film 107 or the fourth microcrystalline semiconductor film 110. Specifically, since the gas containing nitrogen is contained in the source gas, the crystal growth is partly suppressed in the initial period of deposition of the semiconductor film 111; therefore, so that a conical microcrystalline semiconductor region or a pyramidal microcrystalline semiconductor region grows and an amorphous semiconductor region is formed. Further, at a middle stage or a later stage of the deposition, crystal growth in the conical or pyramidal microcrystalline semiconductor region stops, and is followed by deposition of only the amorphous semiconductor region. Accordingly, in the semiconductor film 111, the microcrystalline semiconductor region 111a and the amorphous semiconductor region 111b which is formed using a well-ordered semiconductor film having fewer defects and a steep tail of a level at a band edge in the valence band, can be formed.

A gas flow ratio of the condition for forming the semiconductor film 111 is as follows: the flow rate of hydrogen is 10 to 2000 times, preferably 10 to 200 times that of the deposition gas containing silicon or germanium. Note that in a gas flow ratio of a condition for forming a normal amorphous semiconductor film, the flow rate of hydrogen is 0 to 5 times that of the deposition gas containing silicon or germanium.

A rare gas may be introduced into the source gas of the semiconductor film 111, so that the deposition rate can be increased.

It is preferable that the thickness of the semiconductor film 111 be 50 nm to 350 nm, further preferably 120 nm to 250 nm.

Figure 4A:
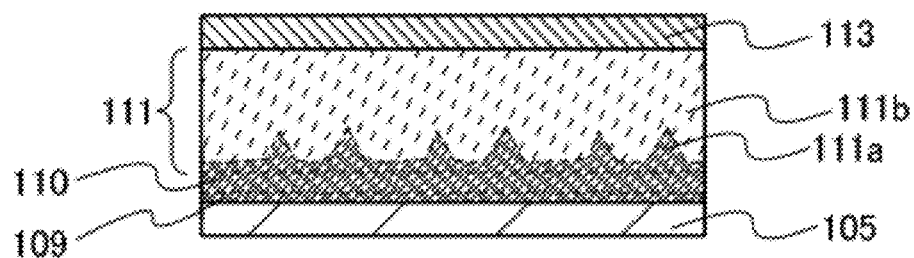
FIGS. 4A and 4B are cross-sectional views illustrating a method for manufacturing a semiconductor device according to one embodiment of the present invention.
Figure 4B:
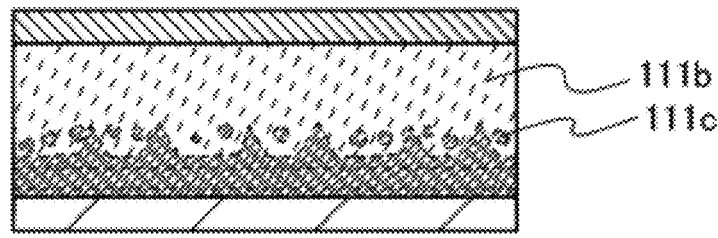

FIGS. 4A and 4B are enlarged views of the portion between the gate insulating film 105 and the impurity semiconductor film 113 which are illustrated in FIG. 3D.

As illustrated in FIG. 4A, the microcrystalline semiconductor region 111a of the semiconductor film 111 has a projected portion and a depressed portion; the microcrystalline semiconductor region 111a has a projecting (conical or pyramidal) shape whose width decreases from the gate insulating film 105 side toward the amorphous semiconductor region 111b (a tip of the projected portion has an acute angle). Alternatively, the microcrystalline semiconductor region 111a may have a projecting (inverted conical or pyramidal) shape whose width increases from the gate insulating film 105 side toward the amorphous semiconductor region 111b.

The thickness of the microcrystalline semiconductor (the total thickness of the third microcrystalline semiconductor film 109, the fourth microcrystalline semiconductor film 110, and the microcrystalline semiconductor region 111a), that is, the distance from the interface between the microcrystalline semiconductor and the gate insulating film 105 to the tip of the projected portion of the microcrystalline semiconductor region 111a may be set to greater than or equal to 5 nm and less than or equal to 310 nm (note that the projected portion of the microcrystalline semiconductor region 111a does not reach the impurity semiconductor film 113), so that the off-state current of the thin film transistor can be reduced.

Further, in order to improve the crystallinity of the microcrystalline semiconductor region 111a, it is preferable that the concentrations of oxygen and nitrogen contained in the semiconductor film 111, which are measured by secondary ion mass spectrometry (SIMS), be less than $1 \times 10^{18}$ atoms/cm$^3$. Here, the concentration is measured by SIMS unless otherwise described.

The amorphous semiconductor region 111b is formed using an amorphous semiconductor containing nitrogen. Nitrogen of the amorphous semiconductor containing nitrogen may exist, for example, as an NH group or an NH$_2$ group. As the amorphous semiconductor, amorphous silicon is used.

The amorphous semiconductor containing nitrogen is a semiconductor having a less amount of the defect absorption spectrum and lower energy at an Urbach edge, measured by a constant photocurrent method (CPM) or photoluminescence spectroscopy, compared to a conventional amorphous semiconductor. That is, as compared to the conventional amorphous semiconductor, the amorphous semiconductor containing nitrogen is a well-ordered semiconductor which has fewer defects and whose tail of a level at a band edge in the valence band is steep. Since the amorphous semiconductor containing nitrogen has a steep tail of a level at a band edge in the valence band, the band gap gets wider and less tunneling current flows. Therefore, the amorphous semiconductor containing nitrogen is provided between the microcrystalline semiconductor region 111a and the impurity semiconductor film 113, whereby the off-state current of the thin film transistor can be reduced. In addition, by providing the amorphous semiconductor containing nitrogen, the on-state current and the field-effect mobility can be increased.

Further, the peak of a spectrum of the amorphous semiconductor containing nitrogen, obtained by performing low-temperature photoluminescence spectroscopy is in the range of 1.31 eV to 1.39 eV. Note that the peak of a spectrum of a microcrystalline semiconductor, typically microcrystalline silicon, obtained by performing low-temperature photoluminescence spectroscopy is in the range of 0.98 eV to 1.02 eV. Therefore, the amorphous semiconductor containing nitrogen has different characteristics from those of a microcrystalline semiconductor.

Further, in addition to the amorphous semiconductor region 111b, the microcrystalline semiconductor region 111a may also contain an NH group or an NH$_2$ group.

Further, as illustrated in FIG. 4B, a semiconductor crystal grain 111c whose grain size is greater than or equal to 1 nm and less than or equal to 10 nm, preferably greater than or equal to 1 nm and less than or equal to 5 nm may be included in the amorphous semiconductor region 111b, so that the on-state current and the filed-effect mobility can be further increased.

The microcrystalline semiconductor having a projecting (conical or pyramidal) shape whose width decreases from the gate insulating film 105 side toward the amorphous semiconductor region 111b or the microcrystalline semiconductor having a projecting shape whose width increases from the gate insulating film 105 toward the amorphous semiconductor region 111b is formed in the following manner: after the second microcrystalline semiconductor film is formed under the condition for depositing a microcrystalline semiconductor, crystal growth is performed under such a condition that the crystal growth is reduced, and an amorphous semiconductor is deposited.

Since the microcrystalline semiconductor region 111a of the semiconductor film 111 has the conical or pyramidal shape or the inverted conical or pyramidal shape, resistance in the vertical direction (film thickness direction) of when voltage is applied between the source and drain electrodes in an on state, i.e., resistance of the semiconductor film 111 can be reduced. Further, less tunneling current flows by the provision of the amorphous semiconductor containing nitrogen between the microcrystalline semiconductor region 111a and the impurity semiconductor film 113 because the amorphous semiconductor is a well-ordered semiconductor which has fewer defects and whose tail of a level at a band edge in the valence band is steep. In this manner, in the thin film transistor described in this embodiment, the on-state current and the field-effect mobility can be increased and the off-state current can be reduced.

In this embodiment, the semiconductor film 111 including the microcrystalline semiconductor region 111a and the amorphous semiconductor region 111b is formed using the source gas which contains the gas containing nitrogen. Alternatively, the semiconductor film 111 may be formed in the following manner: a surface of the fourth microcrystalline semiconductor film 110 is exposed to a gas containing nitrogen so that nitrogen is adsorbed to the surface of the fourth microcrystalline semiconductor film 110; and then film deposition is performed using a deposition gas containing silicon or germanium and hydrogen in a source gas.

The impurity semiconductor film 113 is formed using amorphous silicon to which phosphorus is added, microcrystalline silicon to which phosphorus is added, or the like. Amorphous silicon to which phosphorus is added and microcrystalline silicon to which phosphorus is added may be stacked. In the case of forming a p-channel thin film transistor as a thin film transistor, the impurity semiconductor film 113 is formed using microcrystalline silicon to which boron is added, amorphous silicon to which boron is added, or the like. In the case where the semiconductor film 111 achieves an ohmic contact with wirings 129a and 129b, the impurity semiconductor film 113 is not necessarily formed.

The impurity semiconductor film 113 is formed by glow discharge plasma with the use of a mixture of a deposition gas containing silicon, hydrogen, and phosphine (diluted with hydrogen or silane) in a treatment chamber of the plasma CVD apparatus so that amorphous silicon to which phosphorus is added or microcrystalline silicon to which phosphorus is added is formed. In the case of forming a p-channel thin film transistor, the impurity semiconductor film 113 may be formed by glow discharge plasma using diborane instead of phosphine.

In the case where the impurity semiconductor film 113 is formed using microcrystalline silicon to which phosphorus is added or microcrystalline silicon to which boron is added, a microcrystalline semiconductor film, typically a microcrystalline silicon film may be formed between the semiconductor film 111 and the impurity semiconductor film 113, so that characteristics of the interface can be improved. Accordingly, the resistance in the interface between the impurity semiconductor film 113 and the semiconductor film 111 can be reduced. Consequently, the amount of current flowing through the source region, the semiconductor film, and the drain region of the thin film transistor can be increased, which enables an increase in the on-state current and the field-effect mobility.

The resist mask 115 can be formed in a photolithography step.

Next, the third microcrystalline semiconductor film 109, the fourth microcrystalline semiconductor film 110, the semiconductor film 111, and the impurity semiconductor film 113 are etched using the resist mask 115. In this step, the third microcrystalline semiconductor film 109, the fourth microcrystalline semiconductor film 110, the semiconductor film 111, and the impurity semiconductor film 113 are separated for each element, so that a semiconductor stack 117 and an impurity semiconductor film 121 are formed. The semiconductor stack 117 includes a part of the third microcrystalline semiconductor film 109, a part of the fourth microcrystalline semiconductor film 110, and a part of the semiconductor film 111, and the semiconductor stack 117 includes a microcrystalline semiconductor region 117a including a part of the third microcrystalline semiconductor film 109, a part of the fourth microcrystalline semiconductor film 110, and a part of the microcrystalline semiconductor region 111a of the semiconductor film 111, and an amorphous semiconductor region 117b including a part of the amorphous semiconductor region 111b of the semiconductor film 111. Then, the resist mask 115 is removed (see FIG. 3E).

Figure 5A:
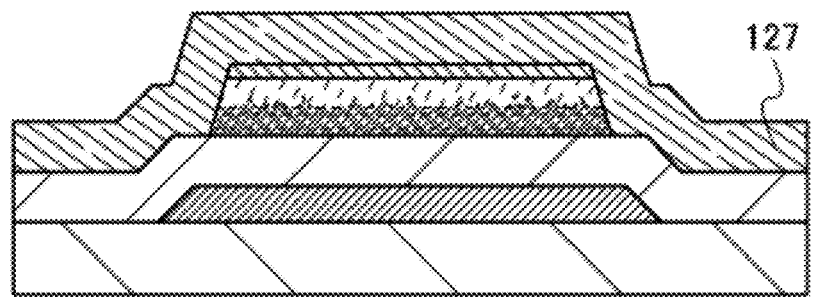
FIGS. 5A to 5C are cross-sectional views illustrating a method for manufacturing a semiconductor device according to one embodiment of the present invention.

Next, a conductive film 127 is formed over the impurity semiconductor film 121 (see FIG. 5A). The conductive film 127 can be formed as a single layer or a stacked layer using aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode 103) may be used as well. Alternatively, crystalline silicon to which an impurity element which serves as a donor is added may be used. Further, a stacked-layer structure in which a film on the side that is in contact with the crystalline silicon to which an impurity element serving as a donor is added is formed using titanium, tantalum, molybdenum, tungsten, or a nitride of any of these elements, and a layer of aluminum or an aluminum alloy is formed thereover may be formed. Alternatively, the conductive film may have a stacked-layer structure where aluminum or an aluminum alloy is sandwiched with titanium, tantalum, molybdenum, tungsten, or nitride of any of these elements, on an upper side and a lower side thereof. The conductive film 127 is formed by a CVD method, a sputtering method, or a vacuum evaporation method. Alternatively, the conductive film 127 may be formed by discharging a conductive nanopaste of silver, gold, copper, or the like by a screen printing method, an inkjet method, or the like and baking the conductive nanopaste.

Figure 5B:
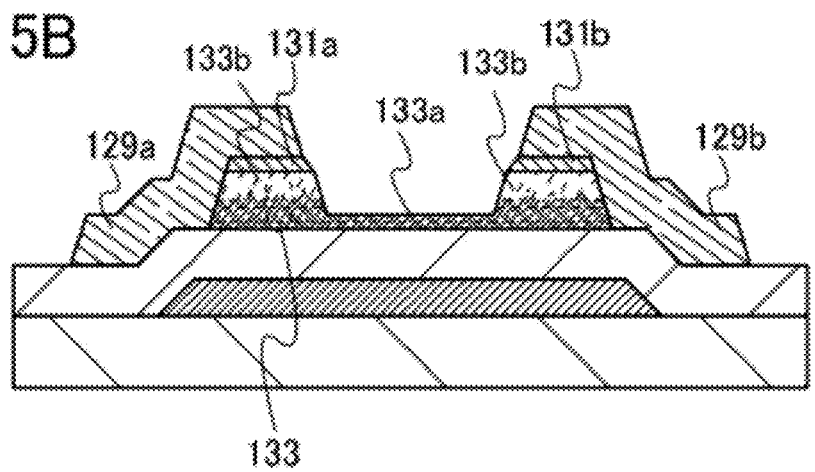
Figure 5C:
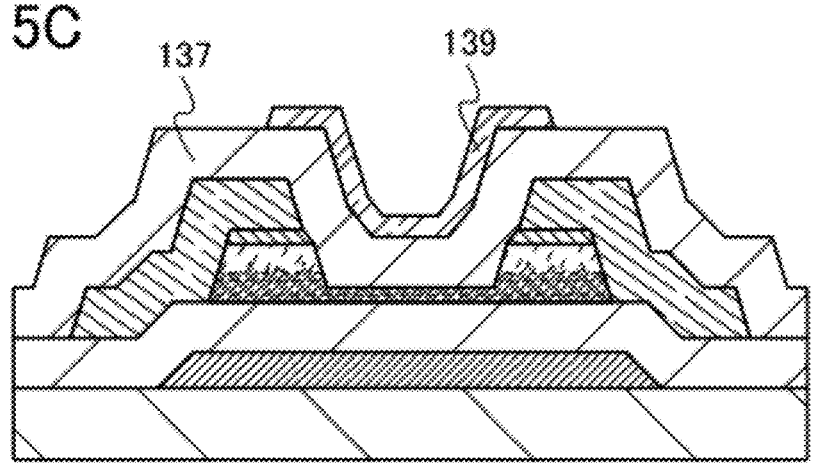

Next, a resist mask is formed in a photolithography step, and the conductive film 127 is etched with the use of the resist mask, to form the wirings 129a and 129b functioning as a source electrode and a drain electrode (see FIG. 5B). The etching of the conductive film 127 may be either dry etching or wet etching. One of the wirings 129a and 129b functions not only as the source electrode or the drain electrode but also as a signal line. However, without limitation thereto, a signal line may be provided separately from the source and drain electrodes.

Next, the impurity semiconductor film 121 and a part of the semiconductor stack 117 are etched, so that a pair of impurity semiconductor films 131a and 131b functioning as a source region and a drain region and a semiconductor stack 133 including a microcrystalline semiconductor region 133a and a pair of amorphous semiconductor regions 133b are formed.

The etching of the semiconductor stack 117 is performed so that the microcrystalline semiconductor region 133a is exposed, whereby the semiconductor stack 133 is formed in which the microcrystalline semiconductor region 133a and the amorphous semiconductor region 133b are stacked in a region which is covered with the wiring 129a, 129b, and the microcrystalline semiconductor region 133a is exposed in a region which is not covered with the wiring 129a, 129b but overlaps with at least the gate electrode. In other words, the semiconductor stack 133 in which the microcrystalline semiconductor region 133a is exposed in a back channel is formed.

In the etching step here, although the end of the wiring 129a, 129b may be aligned with the end of the impurity semiconductor film 131a, 131b, they are not aligned with each other in some cases.

Next, dry etching may be performed. The dry etching is performed with a low etching rate of the microcrystalline semiconductor region 133a and the amorphous semiconductor region 133b so that the exposed microcrystalline semiconductor region 133a and the exposed amorphous semiconductor region 133b are not damaged. As an etching gas, $Cl_2$, $CF_4$, $N_2$, or the like is typically used. There is no particular limitation on an etching method; an inductively coupled plasma (ICP) method, a capacitively coupled plasma (CCP) method, an electron cyclotron resonance (ECR) method, a reactive ion etching (RIE) method, or the like can be used.

Next, surfaces of the microcrystalline semiconductor region 133a and the amorphous semiconductor region 133b are subjected to plasma treatment, typically, water plasma treatment, oxygen plasma treatment, ammonia plasma treatment, nitrogen plasma treatment, or the like.

The water plasma treatment can be performed by generating plasma using a gas containing water as its main component, introduced into a reaction space. After that, the resist mask is removed. The resist mask may be removed before the dry etching on the impurity semiconductor film 121 and the semiconductor stack 117.

As described above, after the microcrystalline semiconductor region 133a and the amorphous semiconductor region 133b are formed, dry etching is further performed under such a condition that the microcrystalline semiconductor region 133a and the amorphous semiconductor region 133b are not damaged, whereby an impurity such as a residue existing on the exposed microcrystalline semiconductor region 133a and the exposed amorphous semiconductor region 133b can be removed. Further, the water plasma treatment follows the dry etching to be performed, whereby a defect of the microcrystalline semiconductor region 133a can be reduced. Moreover, by the plasma treatment, a higher insulating property between the source region and the drain region can be obtained, and thus, the off-state current of the completed thin film transistor can be reduced, and variation in electric characteristics can be reduced.

Note that the resist mask is removed after the wirings 129a and 129b are formed by etching the conductive film 127 with the use of the resist mask and the amorphous semiconductor region 117b of the semiconductor stack 117 is partly etched. Then, parts of the amorphous semiconductor region and the microcrystalline semiconductor region of the semiconductor stack 117 are etched using the wirings 129a and 129b as masks, so that the semiconductor stack 133 in which the microcrystalline semiconductor region 133a is exposed can be formed. Through this process, the microcrystalline semiconductor region 133a is prevented from being in contact with the resist stripper and a residue of the resist. Further, since the amorphous semiconductor region 133b is etched using the wirings 129a and 129b to expose a part of the microcrystalline semiconductor region 133a after the resist mask is removed, the amorphous semiconductor region which is in contact with the resist stripper and a residue of the resist is not left in the back channel. Consequently, leak current due to the resist stripper and the residue of the resist left in the back channel are not generated, which can further reduce the off-state current of the thin film transistor.

Through the above-described process, a single-gate thin film transistor can be manufactured. Further, by employing the structure described in this embodiment, a thin film transistor with low off-state current, high on-state current, and high field-effect mobility can be manufactured with high productivity.

Next, an insulating film 137 (also referred to as a second gate insulating film) is formed. The insulating film 137 can be formed in a manner similar to that for the gate insulating film 105.

Next, a resist mask is formed in a photolithography step and an opening (not shown) is formed in the insulating film 137 with the use of the mask. Next, a back-gate electrode 139 (also referred to as a second gate electrode) is formed (see FIG. 5C). Through the above-described process, a dual-gate thin film transistor can be manufactured.

The back-gate electrode 139 can be formed in a manner similar to that for the wirings 129a and 129b. Further, the back-gate electrode 139 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the back-gate electrode 139 can be formed using a conductive composition containing a light-transmitting conductive high molecule (also referred to as a conductive polymer). The back-gate electrode 139 preferably has a sheet resistivity of 10000 ohms/square or less and a light transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive high molecule can be used. Examples of the π-electron conjugated conductive high molecule are polyaniline; a derivative of polyaniline; polypyrrole; a derivative of polypyrrole; polythiophene; a derivative of polythiophene; a copolymer of two or more of aniline, pyrrole, and thiophene; and a derivative of such a copolymer.

The back-gate electrode 139 is formed by a CVD method, a sputtering method, or a vacuum evaporation method. Alternatively, the back-gate electrode 139 may be formed by discharging a conductive nanopaste of silver, gold, copper, or the like by a screen printing method, an inkjet method, or the like and baking the conductive nanopaste. The back-gate electrode 139 can be formed in the following manner: a thin film is formed using any of the materials described above; a resist mask is formed in a photolithography step; and the thin film is etched using the mask. Alternatively, a conductive composition including a light-transmitting conductive high molecule is applied or printed, and baked to form the back-gate electrode 139.

Next, the shape of the back-gate electrode is described with reference to FIGS. 6A to 6D that are top views of thin film transistors.

Figure 6A:
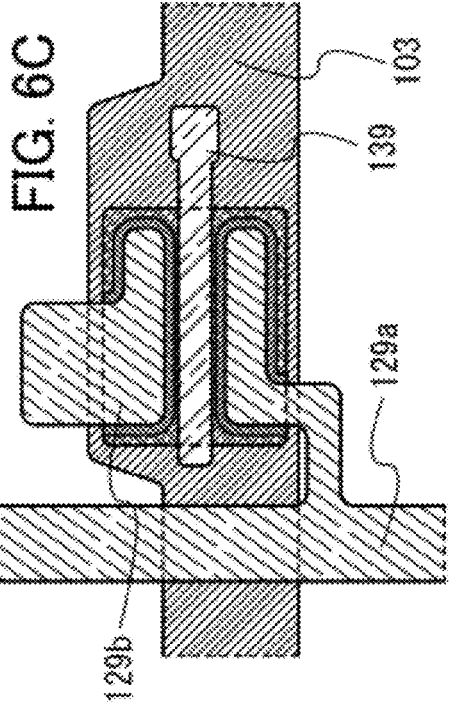
FIGS. 6A to 6D are top views illustrating a method for manufacturing a semiconductor device according to one embodiment of the present invention.

As illustrated in FIG. 6A, the back-gate electrode 139 can be formed in parallel to the gate electrode 103. In that case, voltage applied to the back-gate electrode 139 and that applied to the gate electrode 103 can be controlled separately.

Thus, the threshold voltage of the thin film transistor can be controlled. Further, in the microcrystalline semiconductor region, regions in which carriers flow, that is, channel regions are formed on the gate insulating film 105 side and on the insulating film 137 side; thus, the on-state current of the thin film transistor can be increased.

Figure 6C:
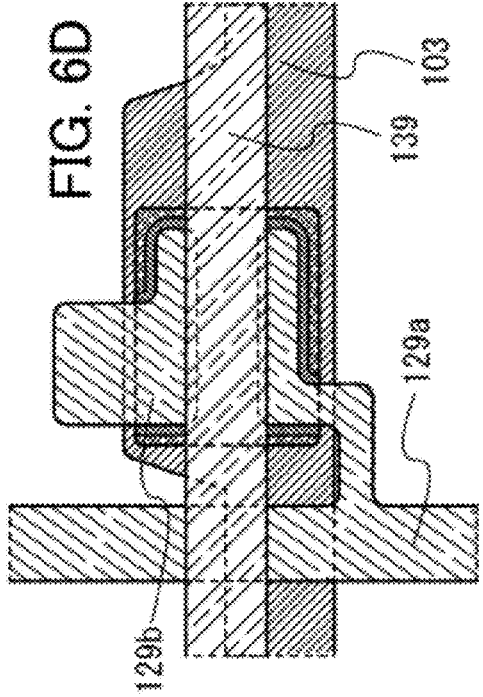
Figure 6B:
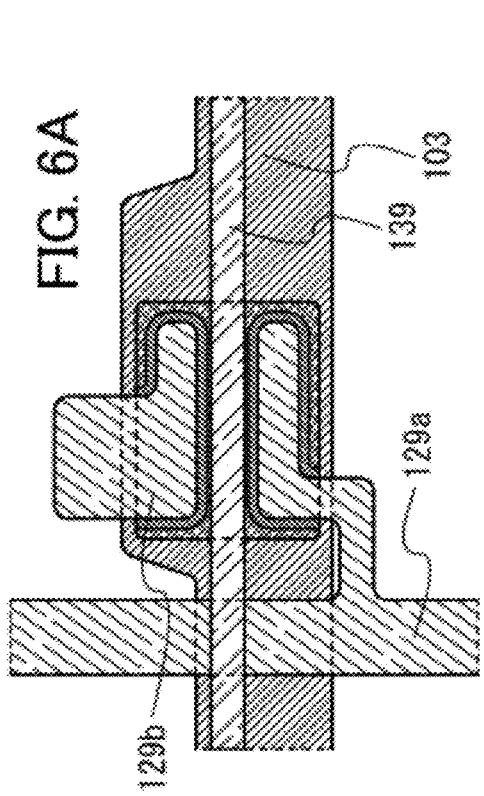

As illustrated in FIG. 6B, the back-gate electrode 139 can be connected to the gate electrode 103. That is, the gate electrode 103 and the back-gate electrode 139 can be connected through an opening 150 formed in the gate insulating film 105 and the insulating film 137. In that case, voltage applied to the back-gate electrode 139 is equal to voltage applied to the gate electrode 103. As a result, in the microcrystalline semiconductor region of the semiconductor layer, regions in which carriers flow, that is, channel regions are formed on the gate insulating film 105 side and on the insulating film 137 side; thus, the on-state current of the thin film transistor can be increased.

Further alternatively, as illustrated in FIG. 6C, the back-gate electrode 139 is not necessarily connected to the gate electrode 103 but may be in a floating state. In that case, channel regions are formed on the gate insulating film 105 side and on the insulating film 137 side in the microcrystalline semiconductor region without applying voltage to the back-gate electrode 139; thus, the on-state current of the thin film transistor can be increased.

Figure 6D:
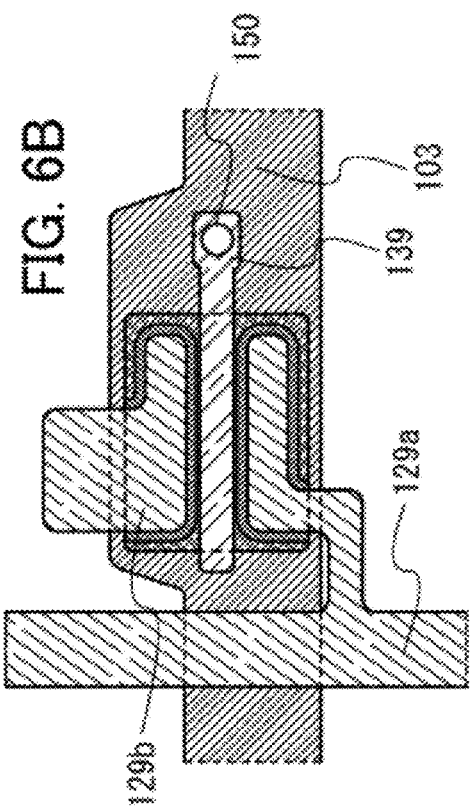

As illustrated in FIG. 6D, the back-gate electrode 139 may overlap with the wirings 129a and 129b with the insulating film 137 provided therebetween. Although FIG. 6D illustrates the case of using the back-gate electrode 139 illustrated in FIG. 6A, the back-gate electrode 139 of FIG. 6B or FIG. 6C may be made to overlap with the wirings 129a and 129b as well.

In the single-gate thin film transistor and dual-gate thin film transistor which are described in this embodiment, the channel region can be formed using a microcrystalline semiconductor film having high crystallinity and high flatness in which an area occupied by a space between crystal grains is small. Therefore, in the single-gate thin film transistor and dual-gate thin film transistor, the amount of transferring carriers is increased, so that the on-state current and the field-effect mobility can be increased. Furthermore, since the amorphous semiconductor region 133b is provided between the microcrystalline semiconductor region 133a and the impurity semiconductor film 131a, 131b, the off-state current of the thin film transistor can be reduced. Accordingly, the area of the single-gate thin film transistor or the area of the dual-gate thin film transistor can be reduced, which enables high integration of a semiconductor device. Further, by using the thin film transistor described in this embodiment for a driver circuit of a display device, the size of the driver circuit can be decreased, which enables the frame size of the display device to be decreased.

Embodiment 3

In this embodiment, a method for manufacturing a thin film transistor in which the off-state current is lower as compared to Embodiment 2 will be described with reference to FIGS. 3A to 3E and FIGS. 7A to 7C.

Figure 7A:
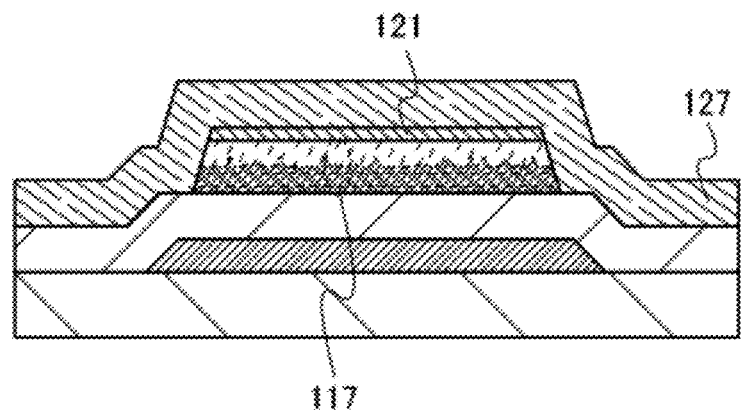
FIGS. 7A to 7C are cross-sectional views illustrating a method for manufacturing a semiconductor device according to one embodiment of the present invention.

Similarly to Embodiment 2, after the steps illustrated in FIGS. 3A to 3E, the conductive film 127 is formed over the semiconductor stack 117 and the impurity semiconductor film 121 as illustrated in FIG. 7A.

Next, a resist mask is formed in a photolithography step, and the conductive film 127 is etched with the use of the resist mask, to form the wirings 129a and 129b functioning as a source electrode and a drain electrode. The etching of the conductive film 127 may be either dry etching or wet etching. One of the wirings 129a and 129b functions not only as the source electrode or the drain electrode but also as a signal line. However, without limitation thereto, a signal line may be provided separately from the source and drain electrodes.

Figure 7B:
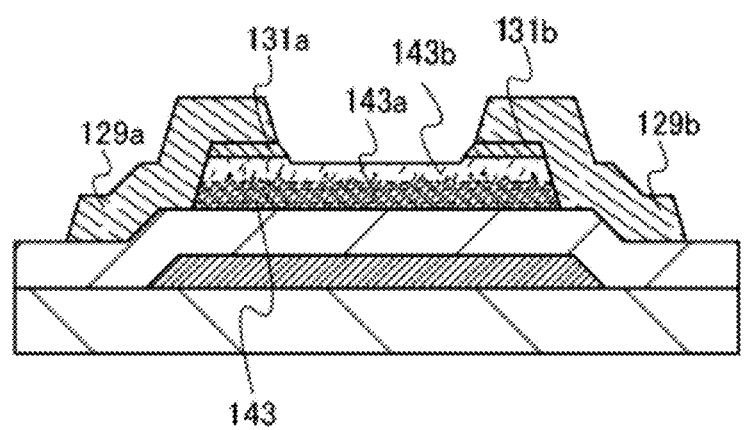
Figure 7C:
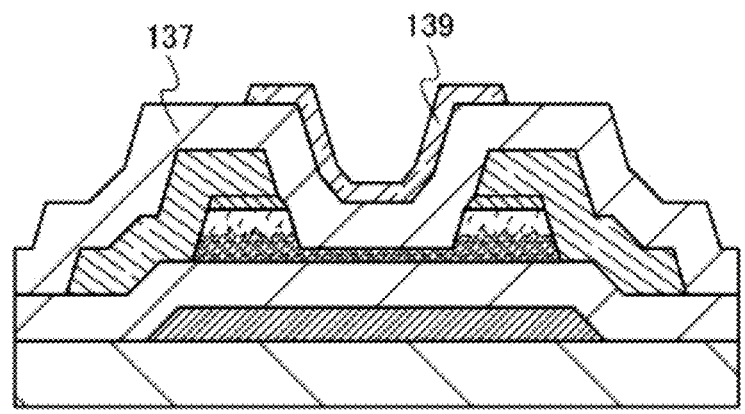

Next, the impurity semiconductor film 121 and a part of the semiconductor stack 117 are etched, so that the pair of impurity semiconductor films 131a and 131b functioning as a source region and a drain region and a semiconductor stack 143 including a microcrystalline semiconductor region 143a and an amorphous semiconductor region 143b are formed (see FIG. 7B). The etching of the semiconductor stack 117 is performed so that the amorphous semiconductor region 143b is exposed, whereby the semiconductor stack 143 is formed in which the amorphous semiconductor region 143b is exposed in a back channel.

Next, dry etching may be performed similarly to Embodiment 2.

Next, similarly to Embodiment 2, a surface of the amorphous semiconductor region 143b may be subjected to plasma treatment, typically, water plasma treatment, oxygen plasma treatment, ammonia plasma treatment, nitrogen plasma treatment, or the like.

Through the above-described process, a single-gate thin film transistor can be manufactured. Further, by employing the structure described in this embodiment, a thin film transistor with low off-state current, high on-state current, and high field-effect mobility can be manufactured with high productivity.

Then, the insulating film 137 is formed. The insulating film 137 can be formed in a manner similar to that for the gate insulating film 105.

Next, a resist mask is formed in a photolithography step and an opening (not shown) is formed in the insulating film 137 with the use of the mask. Next, the back-gate electrode 139 is formed (see FIG. 7C). Through the above-described process, a dual-gate thin film transistor can be manufactured.

In the single-gate thin film transistor and dual-gate thin film transistor which are described in this embodiment, the channel region can be formed using a microcrystalline semiconductor film having high crystallinity and high flatness in which an area occupied by a space between crystal grains is small. Therefore, in the single-gate thin film transistor and dual-gate thin film transistor, the amount of transferring carriers is increased, so that the on-state current and the field-effect mobility can be increased. Furthermore, since the amorphous semiconductor region 143b is provided between the microcrystalline semiconductor region 143a and the impurity semiconductor film 131a, 131b, and in the back channel, the off-state current of the thin film transistor can be reduced. Accordingly, the area of the single-gate thin film transistor or the area of the dual-gate thin film transistor can be reduced, which enables high integration of a semiconductor device. Further, by using the thin film transistor described in this embodiment for a driver circuit of a display device, the size of the driver circuit can be decreased, which enables the frame size of the display device to be decreased.

Embodiment 4

In this embodiment, a method for manufacturing a thin film transistor, in which the off-state current can be further reduced as compared to Embodiments 2 and 3 will be described with reference to FIGS. 3A to 3E, FIGS. 5A to 5C, and FIGS. 8A to 8C. Although Embodiment 2 is referred to here, the description of Embodiment 3 can be applied as appropriate.

Figure 8A:
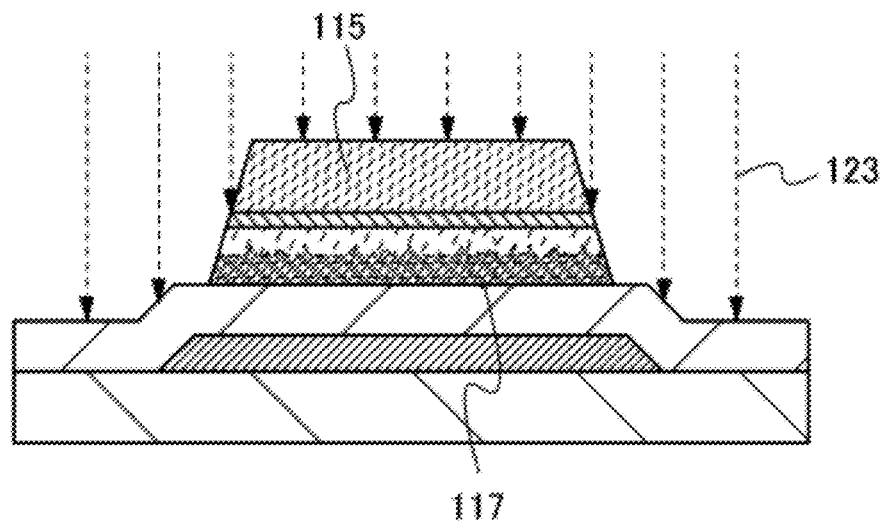
FIGS. 8A to 8C are cross-sectional views illustrating a method for manufacturing a semiconductor device according to one embodiment of the present invention.

In a manner similar to Embodiment 2, the semiconductor stack 117 as illustrated in FIG. 8A is formed through the process illustrated in FIGS. 3A to 3D.

Next, plasma treatment is performed in which a side surface of the semiconductor stack 117 is exposed to plasma 123 with the resist mask 115 left. In this embodiment, plasma is generated in an oxidizing gas atmosphere or a nitriding gas atmosphere, and the semiconductor stack 117 is exposed to the plasma 123. Examples of the oxidizing gas include oxygen, ozone, dinitrogen monoxide, water vapor, a mixed gas of oxygen and hydrogen, and the like. Examples of the nitriding gas include nitrogen, ammonia, nitrogen fluoride, nitrogen chloride, chloroamine, fluoroamine, and the like. Plasma generation in the oxidizing gas atmosphere or the nitriding gas atmosphere causes a radical to be generated. The radical reacts with the semiconductor stack 117, which can form an insulating region that contains an oxide or a nitride on the side surface of the semiconductor stack 117. Instead of the irradiation with plasma, irradiation with ultraviolet light may be employed to generate a radical.

Figure 8B:
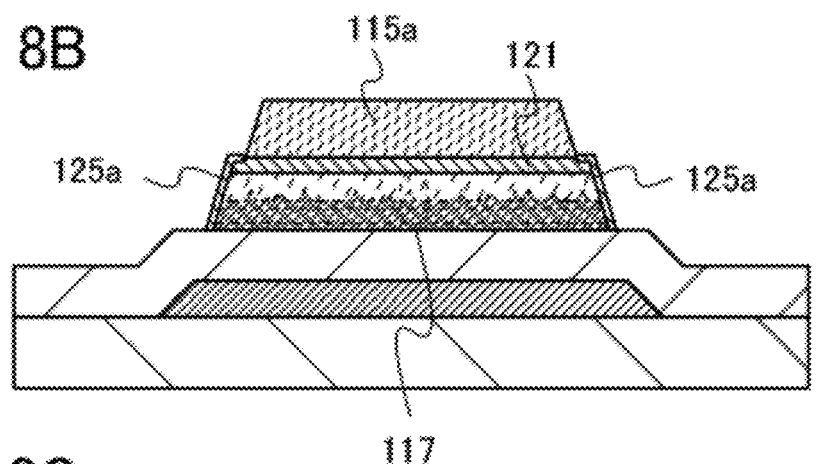

In the case of using oxygen, ozone, water vapor, or a mixed gas of oxygen and hydrogen as the oxidizing gas, the resist recedes by plasma irradiation, so that a resist mask 115a which is smaller than the resist mask 115 is formed as illustrated in FIG. 8B. Therefore, by the plasma treatment, the exposed impurity semiconductor film 121 is oxidized together with the side wall of the semiconductor stack 117, so that an insulating region 125a is formed on the side wall and a part of the top surface of the impurity semiconductor film 121 and the side wall of the semiconductor stack 117.

Figure 8C:
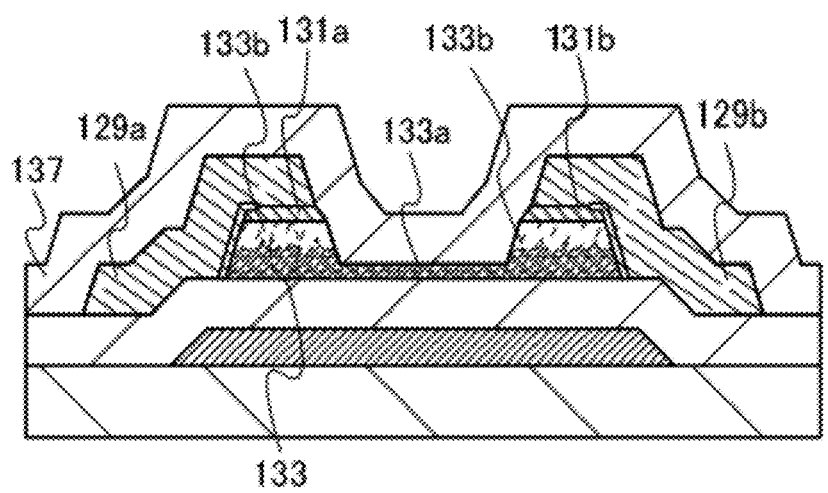

Next, as described in Embodiment 2, through the process illustrated in FIGS. 5A and 5B, the wirings 129a and 129b functioning as a source electrode and a drain electrode, the pair of impurity semiconductor films 131a and 131b functioning as a source region and a drain region, the semiconductor stack 133 including the microcrystalline semiconductor region 133a and the pair of amorphous semiconductor regions 133b, and the insulating film 137 are formed as illustrated in FIG. 8C. Accordingly, a single-gate thin film transistor can be manufactured.

Although not shown, when a back-gate electrode is formed over the insulating film 137, a dual-gate thin film transistor can be manufactured.

In the single-gate thin film transistor and dual-gate thin film transistor which are described in this embodiment, a channel region can be formed using a microcrystalline semiconductor film having high crystallinity and high flatness in which an area occupied by a space between crystal grains is small. Furthermore, since the insulating region that contains an oxide or a nitride is provided between the semiconductor stack 133 and the wiring 129a, 129b, holes injected from the wirings 129a and 129b to the semiconductor stack 133 can be reduced, so that the off-state current of the thin film transistor is reduced and the on-state current and the field-effect mobility are increased. Accordingly, the area of the thin film transistor can be reduced, which enables high integration of a semiconductor device. Further, by using the thin film transistor described in this embodiment for a driver circuit of a display device, the size of the driver circuit can be decreased, which enables the frame size of the display device to be decreased.

Embodiment 5

A thin film transistor can be manufactured, and a semiconductor device having a display function (also referred to as a display device) can be manufactured using the thin film transistor in a pixel portion and further in a driver circuit. Further, a part or whole of the driver circuit including the thin film transistor can be formed over the same substrate as the pixel portion, whereby a system-on-panel can be realized.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC and the like including a controller are mounted on the panel. Furthermore, an element substrate, which corresponds to one embodiment before the display element is completed in a manufacturing process of the display device, is provided with a component for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other state.

The display device means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Embodiment 6

In this embodiment, a photoelectric conversion device that is one embodiment of a semiconductor device is described. As a semiconductor film of the photoelectric conversion device in this embodiment, a microcrystalline semiconductor film having high crystallinity and high flatness in which an area occupied by a space between crystal grains is small as in Embodiment 1 is used. The microcrystalline semiconductor film having high crystallinity and high flatness in which the area occupied by the space between the crystal grains is small is applicable to a semiconductor film having a function of photoelectric conversion, a semiconductor film having a conductivity type, or the like, and is favorably applied to a semiconductor film having a function of photoelectric conversion in particular. Alternatively, a microcrystalline semiconductor film having high crystallinity and high flatness in which an area occupied by a space between crystal grains is small can be formed at an interface between the semiconductor film a function of photoelectric conversion or the semiconductor film having a conductivity type and another film.

By employing the structure described above, resistance (series resistance) caused by the semiconductor film having a function of photoelectric conversion or the semiconductor film having a conductivity type can be reduced, resulting in improvement of characteristics of the photoelectric conversion device. Further, it is possible to suppress optical and electrical loss at the interface between the semiconductor film a function of photoelectric conversion or the semiconductor film having a conductivity type and another film, so that the photoelectric conversion efficiency can be improved. With reference to FIGS. 9A to 9D and FIG. 10, one embodiment of a method for manufacturing a photoelectric conversion device will now be described.

Figure 9A:
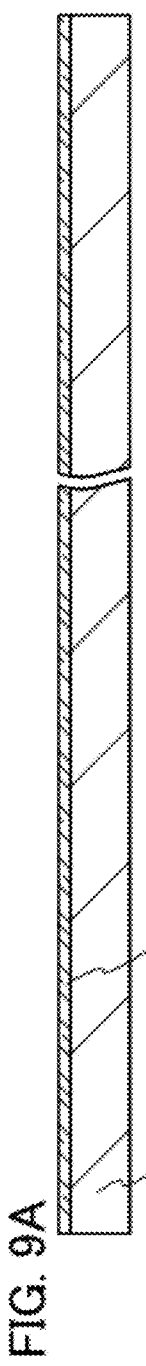
FIGS. 9A to 9D are cross-sectional views illustrating a method for manufacturing a photoelectric conversion device according to one embodiment of the present invention.

As illustrated in FIG. 9A, a first electrode 202 is formed over a substrate 200.

As the substrate 200, the substrate 51 described in Embodiment 1 can be used as appropriate.

Note that a surface of the substrate 200 may have a texture structure which is capable of improving the photoelectric conversion efficiency.

In this embodiment, since light enters from the back side (the lower part in the drawing) of the substrate 200, a light-transmitting substrate is used. However, the present invention is not limited thereto in the case where light enters from a second electrode side (the upper part in the drawing); in this case, a semiconductor substrate containing a material such as silicon or a conductive substrate containing a metal material or the like may be used.

The first electrode 202 can be formed using the light-transmitting conductive material which is described relating to the back-gate electrode 139 in Embodiment 2. The first electrode 202 is formed by a sputtering method, a CVD method, a vacuum evaporation method, a coating method, a printing method, or the like.

The first electrode 202 is formed to a thickness of 10 nm to 500 nm, preferably 50 nm to 100 nm.

Note that in this embodiment, since light enters from the back side (the lower part in the drawing) of the substrate 200, the first electrode 202 is formed using a light-transmitting conductive material. However, the present invention is not limited thereto in the case where light enters from the second electrode side (the upper part in the drawing); in such a case, the first electrode 202 can be formed using a conductive material that does not have a light-transmitting property such as aluminum, platinum, gold, silver, copper, titanium, tantalum, or tungsten. In particular, when a material that easily reflects light is used, the photoelectric conversion efficiency can be sufficiently improved.

Like the substrate 200, the first electrode 202 may have a texture structure. Further, an auxiliary electrode formed using a low-resistant conductive material may be separately formed so as to be in contact with the first electrode 202.

Figure 9B:
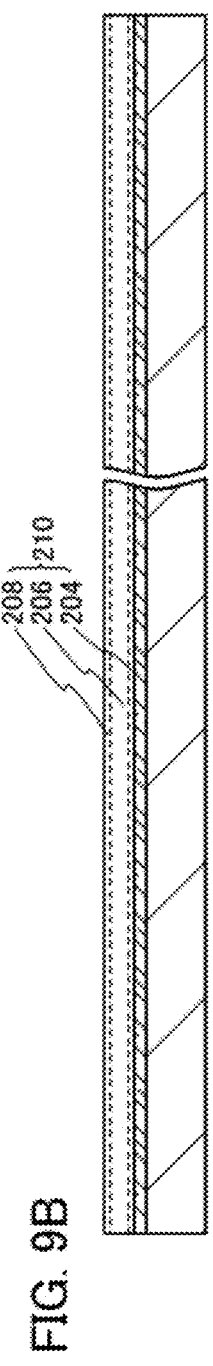
Figure 9C:
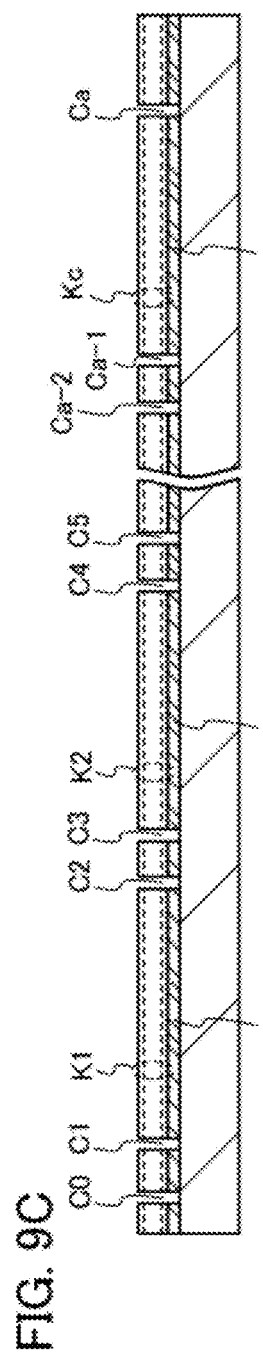

Next, as illustrated in FIG. 9B, a semiconductor film 204 having a first conductivity type is formed over the first electrode 202, a semiconductor film 206 having a function of photoelectric conversion is formed over the semiconductor film 204 having the first conductivity type, and a semiconductor film 208 having a second conductivity type is formed over the semiconductor film 206 having a function of photoelectric conversion.

The semiconductor film 204 having the first conductivity type is typically formed using a semiconductor film containing a semiconductor material to which an impurity element imparting a conductivity type is added. As the semiconductor material, silicon is preferably used in view of productivity, cost, and the like. When silicon is used as the semiconductor material, phosphorus or arsenic, which imparts n-type conductivity, aluminum or boron, which imparts p-type conductivity, or the like is used as the impurity element imparting a conductivity type.

In this embodiment, since light enters from the back side (the lower part in the drawing) of the substrate 200, the conductivity type (first conductivity type) of the semiconductor film 204 having the first conductivity type is preferably a p-type. This is because, for instance, the diffusion length of holes is short as a result of the lifetime of a hole which is as short as half that of an electron, and because more electrons and holes are formed on the side where light enters in the semiconductor film having a function of photoelectric conversion. By applying a p-type to the first conductivity type, current can be extracted before holes are annihilated, whereby a decrease of photoelectric conversion efficiency can be suppressed. Note that when there is no possibility of the above problems, for example, when the semiconductor film having a function of photoelectric conversion is sufficiently thin, the first conductivity type may be an n-type.

Although there is no particular limitation on the crystallinity of the semiconductor film 204 having the first conductivity type, the microcrystalline semiconductor film having high crystallinity and high flatness in which the area occupied by the space between the crystal grains is small, described in Embodiment 1, is preferably used as the semiconductor film 204 having the first conductivity, because it is possible to reduce series resistance and to suppress optical and electrical loss at the interface between the semiconductor film 204 having the first conductivity type and another film as compared to the case of using a conventional microcrystalline semiconductor film. It is needless to say that other semiconductors such as an amorphous semiconductor, a polycrystalline semiconductor, and a single crystal semiconductor can also be used.

Similarly to the substrate 200, the semiconductor film 204 having the first conductivity type may have a texture structure.

The semiconductor film 204 having the first conductivity type can be formed using a deposition gas containing silicon and diborane by a plasma CVD method. Further, the semiconductor film 204 having the first conductivity type is formed to a thickness of 1 nm to 100 nm, preferably 5 nm to 50 nm.

Alternatively, the semiconductor film 204 having the first conductivity type may be formed as follows: a silicon film to which an impurity element imparting a conductivity type is not added is formed by a plasma CVD method or the like; and boron is added by an ion implantation method or the like.

The semiconductor film 206 having a function of photoelectric conversion is formed. As the semiconductor film having a function of photoelectric conversion, silicon, silicon germanium, or the like is used as a semiconductor material.

Here, as a method of manufacturing the semiconductor film 206 having a function of photoelectric conversion, the process for manufacturing the microcrystalline semiconductor film which is described in Embodiment 1 is used. By applying the microcrystalline semiconductor film described in Embodiment 1 to the semiconductor film 206 having a function of photoelectric conversion, series resistance can be reduced and optical and electrical loss at the interface between the semiconductor film 204 and another film can be suppressed as compared to the case of using the conventional microcrystalline semiconductor film.

Because the semiconductor film 206 having a function of photoelectric conversion needs to realize sufficient light absorption, it preferably has a thickness of about 100 nm to 10 μm.

In this embodiment, the second conductivity type is an n-type. The semiconductor film 208 having the second conductivity type can be formed using a material such as silicon to which phosphorus is added as an impurity element imparting a conductivity type. Semiconductor materials that can be used for the semiconductor film 208 having the second conductivity type are the same as those for the semiconductor film 204 having the first conductivity type.

The semiconductor film 208 having the second conductivity type can be formed in a manner similar to that for the semiconductor film 204 having the first conductivity type. For instance, the semiconductor film 208 can be formed using a deposition gas containing silicon and phosphine by a plasma CVD method. Also as the semiconductor film 208 having the second conductivity type, the microcrystalline semiconductor film having high crystallinity in which the number and size of the spaces between the crystal grains are extremely small, which is described in Embodiment 1, is preferably used.

In this embodiment, since light enters from the back side (the lower part in the drawing) of the substrate 200, the conductivity type (second conductivity type) of the semiconductor film 208 having the second conductivity type is preferably an n-type, but one embodiment of the present invention is not limited thereto. When the first conductivity type is an n-type, the second conductivity type is a p-type.

Through the above process, a unit cell 210 which has the semiconductor film 204 having the first conductivity type, the semiconductor film 206 having a function of photoelectric conversion, and the semiconductor film 208 having the second conductivity type is completed.

In order to form a plurality of unit cells over one substrate, openings $C_0$ to $C_a$ penetrating the unit cell 210 and the first electrode 202 are formed by performing laser processing. In this step, the first electrode 202 is divided into first electrodes $T_1$ to $T_c$ and the unit cell 210 is divided into photoelectric conversion layers $K_1$ to $K_b$ (see FIG. 9C). Note that a, b, and c are integers.

The openings $C_0$, $C_2$, $C_4$, . . . , $C_{a-2}$, $C_a$ are openings for insulation. The openings $C_1$, $C_3$, $C_5$, . . . , $C_{a-1}$ are openings for establishing connection between the first electrode 202 and the second electrode formed later. By performing laser processing with the first electrode 202 and the unit cell 210 stacked, separation of the first electrode 202 from the substrate 200 can be prevented in the processing.

Figure 9D:
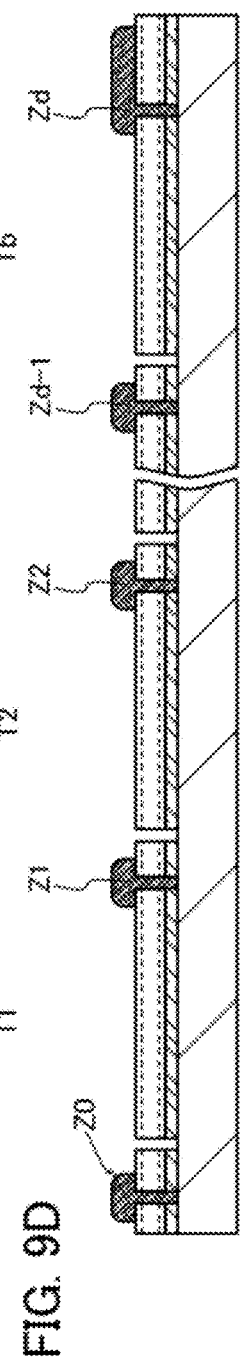

Next, insulating resin layers $Z_0$ to $Z_d$ for filling the openings $C_0, C_2, C_4, \ldots, C_{a-2}, C_a$ and covering upper end portions of these openings are formed (see FIG. 9D). The insulating resin layers $Z_0$ to $Z_d$ are formed using an insulating resin material such as an acrylic-based resin, a phenol-based resin, an epoxy-based resin, or a polyimide-based resin by a screen printing method. For example, an insulating resin pattern is formed by a screen printing method so that the openings $C_0$, $C_2, C_4, \ldots, C_{a-2}, C_a$ are filled with a resin composition in which cyclohexane, isophorone, high-resistance carbon black, aerosil, a dispersing agent, a defoaming agent, and a leveling agent are mixed with a phenoxy resin. After the insulating resin pattern is printed, thermal hardening is performed in an oven at 160° C. for 20 minutes. Thus, the insulating resin layers $Z_0$ to $Z_d$ are obtained. Note that d is an integer.

Figure 10:
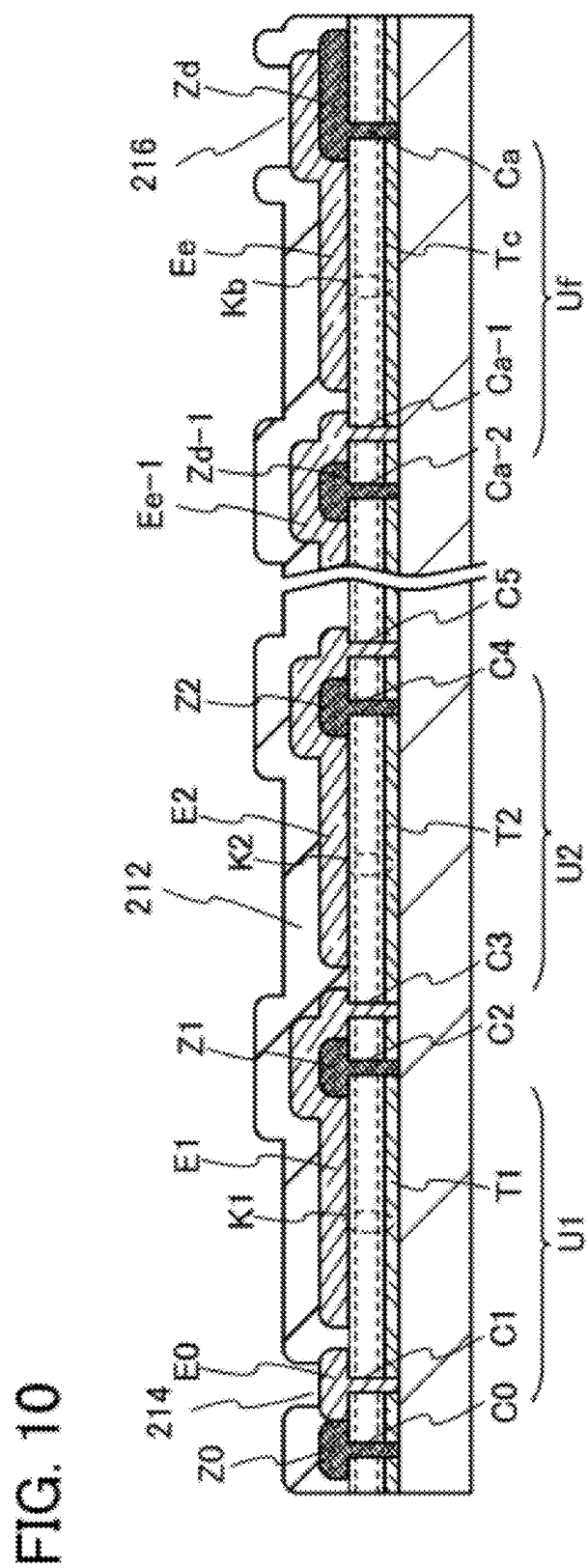
FIG. 10 is a cross-sectional view illustrating a method for manufacturing a photoelectric conversion device according to one embodiment of the present invention.

Next, the second electrodes $E_0$ to $E_e$ are formed (see FIG. 10). The second electrodes $E_0$ to $E_e$ are formed using a conductive material such as metal. They can be formed using a material that easily reflects light, such as aluminum, silver, titanium, or tantalum, for instance. It is preferable to use a material that easily reflects light to form the second electrodes $E_0$ to $E_e$, because in this case light that has not been absorbed by the semiconductor film having a function of photoelectric conversion can again enter the semiconductor film having a function of photoelectric conversion, resulting in improvement of photoelectric conversion efficiency. Note that e is an integer.

As a method for forming the second electrodes $E_0$ to $E_e$, there are a sputtering method, a vacuum evaporation method, a CVD method, a coating method, a printing method, and the like. The second electrodes $E_0$ to $E_e$ are formed to a thickness of 10 nm to 500 nm, preferably 50 nm to 100 nm.

In this embodiment, since light enters from the back side (the lower part in the drawing) of the substrate 200, the second electrodes $E_0$ to $E_e$ are formed using a material that has no light-transmitting property, but the structure of the second electrodes $E_0$ to $E_e$ is not limited thereto. For example, when light enters from the second electrodes $E_0$ to $E_e$ side (the upper part in the drawing), the second electrodes $E_0$ to $E_e$ can be formed using any of the light-transmitting conductive materials for the first electrode 202.

The second electrodes $E_0$ to $E_e$ are formed so as to be connected to the first electrodes $T_1$ to $T_c$ in the openings $C_1$, $C_3$, $C_5$, . . . , $C_{a-1}$. In other words, the openings $C_1$, $C_3$, $C_5$, . . . , $C_{a-1}$ are filled with the second electrodes $E_0$ to $E_e$. In this way, for example, the second electrode $E_1$ is electrically connected to the first electrode $T_2$, and the second electrode $E_{e-1}$ is electrically connected to the first electrode $T_c$. Thus, each of the second electrodes can be electrically connected to the first electrode adjacent thereto, and the photoelectric conversion layers $K_1$ to $K_b$ are electrically connected in series.

Further, an auxiliary electrode formed using a low-resistant conductive material may be formed so as to be in contact with the second electrodes $E_0$ to $E_e$.

A sealing resin layer 212 is formed using an epoxy resin, an acrylic resin, or a silicone resin. In the sealing resin layer 212, an opening 214 and an opening 216 are respectively formed over the second electrode $E_0$ and the second electrode $E_e$. The second electrode $E_0$ and the second electrode $E_e$ are connected respectively through the openings 214 and 216 to external wirings.

Thus, unit cells $U_1$ to $U_f$ including the first electrodes $T_1$ to $T_c$, the photoelectric conversion layers $K_1$ to $K_b$, and the second electrodes $E_1$ to $E_e$, respectively, are formed over the substrate 200. Here, the first electrode $T_c$ is connected to the second electrode $E_{e-1}$ adjacent thereto in the opening $C_{a-1}$. Accordingly, the photoelectric conversion device in which c unit cells are connected in series can be manufactured. The second electrode $E_0$ serves as an output electrode for the first electrode $T_1$ in the unit cell $U_1$. Note that f is an integer.

By the above method, it is possible to manufacture a photoelectric conversion device in which a microcrystalline semiconductor film having high crystallinity and high flatness in which an area occupied by a space between crystal grains is small is used as any of a semiconductor film having a function of photoelectric conversion, a semiconductor film having a first conductivity type, and a semiconductor film having a second conductivity type. This can enhance the photoelectric conversion efficiency of a photoelectric conversion device. Note that, as long as the microcrystalline semiconductor film having high crystallinity by reducing the space between the crystal grains is used as one of the semiconductor film having a function of photoelectric conversion, the semiconductor film having the first conductivity type, and the semiconductor film having the second conductivity type, the film to which the microcrystalline semiconductor film is applied can be changed as appropriate. Further, when the microcrystalline semiconductor film having high crystallinity and high flatness in which the area occupied by the space between the crystal grains is small is used as more than one of the above semiconductor films, the photoelectric conversion efficiency can be more effectively enhanced.

Note that although a photoelectric conversion device having one unit cell is described in this embodiment, a photoelectric conversion device in which two or more unit cells are stacked as appropriate can be provided.

This embodiment can be implemented in appropriate combination with the other embodiments.

Embodiment 7

A semiconductor device disclosed in this specification can be applied to electronic paper. An electronic paper can be used for electronic devices of a variety of fields as long as they can display data. For example, electronic paper can be applied to an electronic book (e-book) reader, a poster, a digital signage, a public information display (PID), an advertisement in a vehicle such as a train, displays of various cards such as a credit card, and the like. An example of the electronic device is illustrated in FIG. 11.

Figure 11:
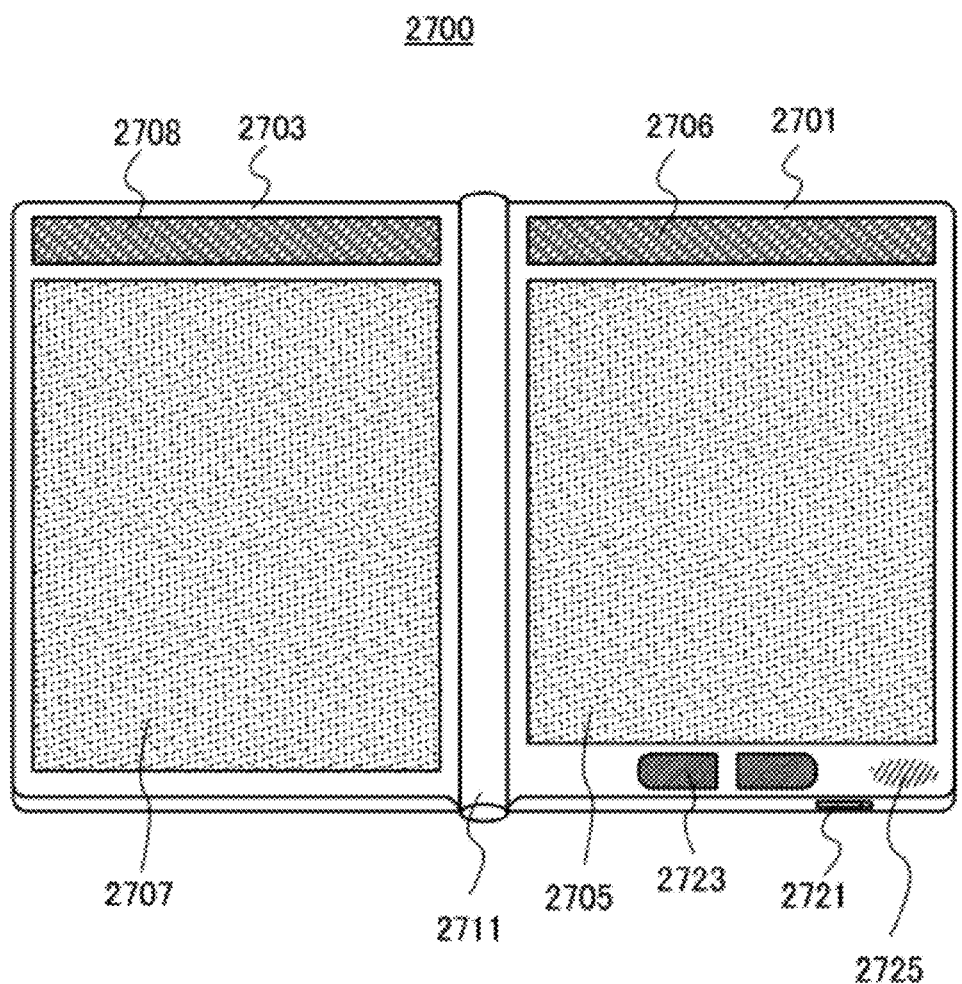
FIG. 11 is an external view illustrating an example of an electronic book reader.

FIG. 11 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be opened and closed like a paper book.

A display portion 2705 and a photoelectric conversion device 2706 are incorporated in the housing 2701. A display portion 2707 and a photoelectric conversion device 2708 are incorporated in the housing 2703. The display portion 2705 and the display portion 2707 may display one image or different images. According to the structure where different images are displayed in different display portions, for example, text can be displayed on the right display portion (the display portion 2705 in FIG. 11) and pictures, diagrams, or photographs can be displayed on the left display portion (the display portion 2707 in FIG. 11).

FIG. 11 illustrates an example in which the housing 2701 is provided with an operation portion and the like. For example, the housing 2701 is provided with a power switch 2721, an operation key 2723, a speaker 2725, and the like. With the operation key 2723, pages can be turned. A keyboard, a pointing device, or the like may also be provided for the surface of the housing, on which the display portion is provided. Further, an external connection terminal (an earphone terminal, a USB terminal, a terminal that can be connected to various cables such as an AC adapter and a USB cable, or the like), a recording medium insertion portion, and the like may be provided for the back surface or the side surface of the housing. Moreover, the electronic book reader 2700 may have a function of an electronic dictionary.

The electronic book reader 2700 may have a structure capable of wirelessly transmitting and receiving data. Through wireless communication, book data or the like can be purchased and downloaded from an electronic book server.

Embodiment 8

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 12A:
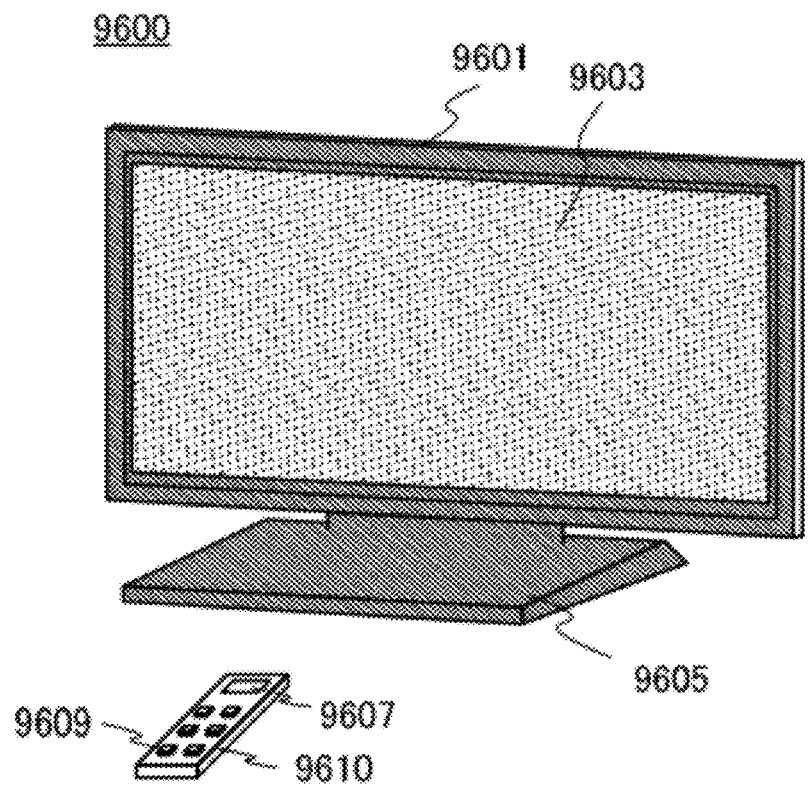
FIGS. 12A and 12B are external views illustrating an example of a television device and an example of a digital photo frame.

FIG. 12A illustrates an example of a television device. In a television device 9600, a display portion 9603 is incorporated in a housing 9601. The display portion 9603 can display images. In FIG. 12A, the housing 9601 is supported by a stand 9605.

The television device 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

The television device 9600 is provided with a receiver, a modem, and the like. With the use of the receiver, general television broadcasting can be received. Moreover, the television set may be connected to a communication network with or without wires via the modem, whereby one-way (from sender to receiver) or two-way (between sender and receiver or between receivers) information communication can be performed.

Figure 12B:
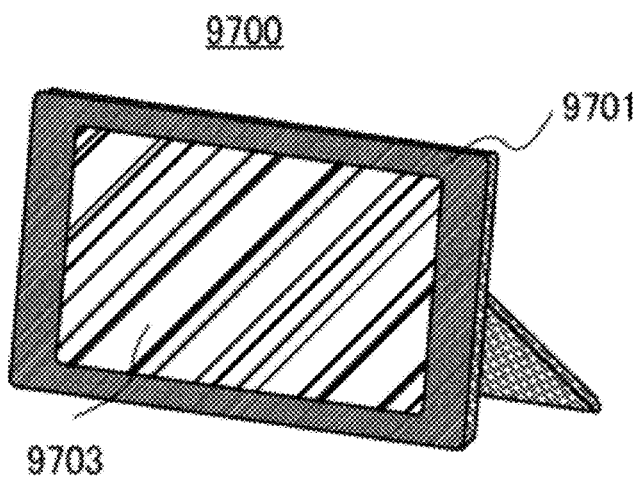

FIG. 12B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these elements may be provided for the surface on which the display portion is provided, it is preferable to provide them for the side surface or the back surface for the design of the digital photo frame 9700. For example, a memory storing data of an image taken with a digital camera is inserted in the recording medium insertion portion of the digital photo frame, whereby the image data can be transferred and displayed on the display portion 9703.

The digital photo frame 9700 may be configured to transmit and receive data wirelessly. A structure may be employed in which desired image data is obtained wirelessly to be displayed.

Figure 13:
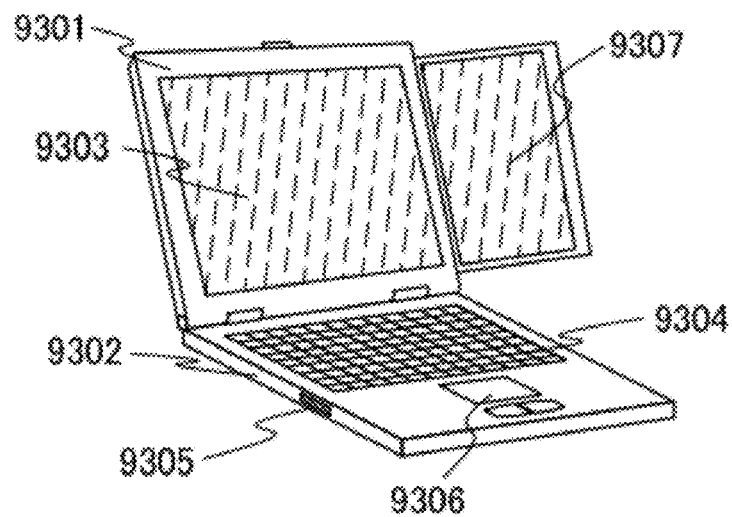
FIG. 13 is an external view illustrating an example of a portable computer.

FIG. 13 is an external view illustrating an example of a portable computer.

In the portable computer in FIG. 13, a top housing 9301 and a bottom housing 9302 are connected to each other so that the top housing 9301 having a display portion 9303 and the bottom housing 9302 having a keyboard 9304 can overlap with each other by closing a hinge unit. The portable computer in FIG. 13 is convenient for carrying, and in the case of using the keyboard for data input, the hinge unit is opened so that the user can input looking at the display portion 9303.

The bottom housing 9302 includes a pointing device 9306 with which data input can be performed, in addition to the keyboard 9304. Further, when the display portion 9303 is a touch input panel, data input can be performed by touching a part of the display portion 9303. The bottom housing 9302 includes an arithmetic function portion such as a CPU or hard disk. In addition, the bottom housing 9302 includes an external connection terminal 9305 to which another device such as a communication cable conformable to communication standards of a USB can be connected.

The top housing 9301 includes a display portion 9307 and can keep the display portion 9307 therein by sliding it toward the inside of the top housing 9301; thus, wide display screen can be achieved. In addition, the user can adjust the direction of a screen of the display portion 9307 which can be kept in the top housing 9301. When the display portion 9307 which can be kept in the top housing 9301 is a touch input panel, data input can be performed by touching a part of the display portion 9307 which can be kept in the top housing 9301.

The display portion 9303 or the display portion 9307 which can be kept in the top housing 9301 uses an image display device of a liquid crystal display panel, a light-emitting display panel such as an organic light-emitting element or an inorganic light-emitting element, or the like.

In addition, the portable computer illustrated in FIG. 13 can be provided with a receiver and the like to receive TV broadcasting to display images on the display portion. The user can watch TV broadcasting when the whole screen of the display portion 9307 is slid so as to be drawn from the top housing 9301 while the hinge unit which connects the top housing 9301 and the bottom housing 9302 is kept closed. In that case, the hinge unit is not opened and display is not performed on the display portion 9303, and start up of only a circuit for displaying the TV broadcasting is performed, so that power can be consumed to the minimum, which is useful for the portable computer whose battery capacity is limited.

Example 1

In Example 1, the flatness and crystallinity of a microcrystalline semiconductor film are described with reference to FIGS. 1A to 1D and FIGS. 14A to 14C.

First, methods for manufacturing samples are described with reference to FIGS. 1A to 1D.

As illustrated in FIG. 1A, the insulating film 55 was formed over the substrate 51 and the first microcrystalline semiconductor film 57 was formed over the insulating film 55. The substrate at this stage is Sample 1.

Here, a glass substrate (EAGLE XG manufactured by Corning Incorporated) was used as the substrate 51.

Here, a 100-nm-thick silicon oxide layer was formed by a plasma CVD method as the insulating film 55. The deposition condition at this time was as follows: a source gas was introduced and stabilized, where the flow rate of tetraethyl orthosilicate (TEOS) was 15 sccm and the flow rate of oxygen was 750 sccm; the pressure in a treatment chamber was 100 Pa; the temperature of an upper electrode was 300° C. and the temperature of a lower electrode was 297° C.; the RF power source frequency was 27.12 MHz; and the power of the RF power source was 300 W, and plasma discharge was performed.

As the first microcrystalline semiconductor film 57, a 30-nm-thick microcrystalline silicon film was formed by a plasma CVD method. The deposition condition for the first microcrystalline semiconductor film 57 was as follows: a source gas was introduced and stabilized, where the flow rate of silane was 2.5 sccm, the flow rate of hydrogen was 750 sccm, and the flow rate of argon was 750 sccm; the pressure in the treatment chamber was 1237 Pa; the RF power source frequency was 13.56 MHz; and the power of the RF power source was 60 W. Here, the gap between the upper electrode and the lower electrode was 7 mm. The temperature of the upper electrode was 200° C. and that of the lower electrode was 299° C. As the upper electrode, an uneven electrode having projections at intervals of 3 mm was used.

Then, a second microcrystalline semiconductor film 58c was formed by exposing the first microcrystalline semiconductor film 57 to plasma generated in a $NF_3$ atmosphere. The substrate at this stage is Sample 2.

The plasma generated in the $NF_3$ atmosphere was generated under a condition that $NF_3$ at a flow rate of 20 sccm and $N_2$ at a flow rate of 80 sccm were introduced into a treatment chamber of an ICP apparatus, the power applied to an ICP electrode was 2000 W, the power applied to a bias electrode was 0 W, the pressure was 0.67 Pa, and the substrate temperature was 40° C. The first microcrystalline semiconductor film 57 was exposed to the plasma for 20 seconds.

As another sample, a second microcrystalline semiconductor film 58d was formed by exposing the first microcrystalline semiconductor film 57 to plasma generated in an Ar atmosphere. The substrate at this stage is Sample 3.

The plasma generated in the Ar atmosphere was generated under a condition that Ar at a flow rate of 300 sccm was introduced into a treatment chamber of an ICP apparatus, the power applied to an ICP electrode was 4000 W, the power applied to a bias electrode was 750 W, the pressure was 0.5 Pa, and the substrate temperature was 40° C. The first microcrystalline semiconductor film 57 was exposed to the plasma for 20 seconds.

Figure 14A:
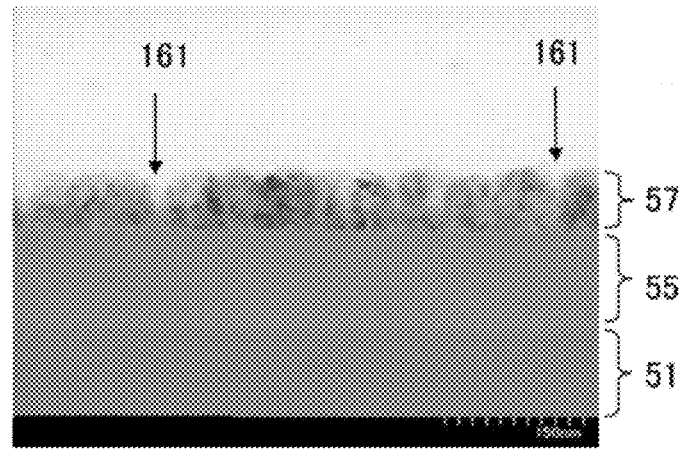
FIGS. 14A to 14C are cross-sectional STEM images of a microcrystalline semiconductor film.
Figure 14B:
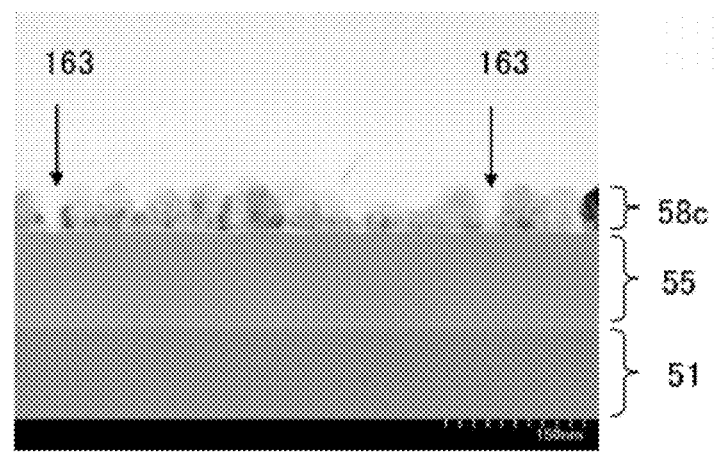
Figure 14C:
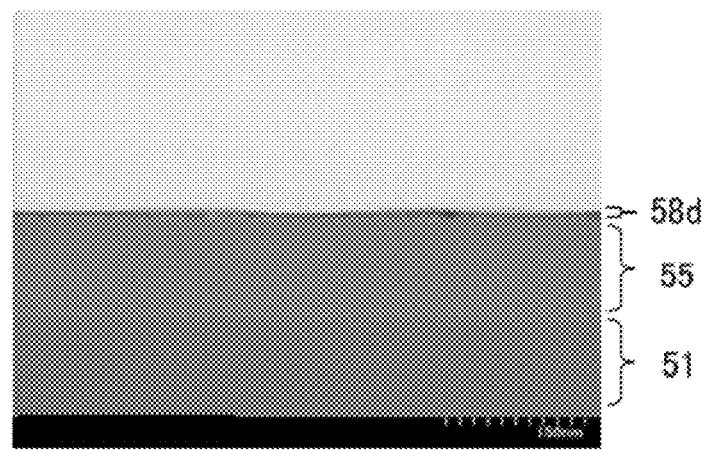

The results of observation of Samples 1 to 3 by STEM are shown in FIGS. 14A to 14C. Here, these samples were measured with the use of an Ultra-thin Film Evaluation System HD-2300 manufactured by Hitachi High-Technologies Corporation. The magnification was 200000 times. FIG. 14A is a cross-sectional STEM image of Sample 1; FIG. 14B, a cross-sectional STEM image of Sample 2; and FIG. 14C, a cross-sectional STEM image of Sample 3.

As shown in FIG. 14A, spaces 161 were formed between crystal grains in the first microcrystalline semiconductor film 57.

As shown in FIG. 14B, when the first microcrystalline semiconductor film 57 was exposed to the plasma which reacted with silicon, the microcrystalline semiconductor film was isotropically etched; thus, the second microcrystalline semiconductor film 58c having larger spaces 163 than Sample 1 and crystal grains was formed.

On the other hand, as shown in FIG. 14C, when the first microcrystalline semiconductor film 57 was exposed to the plasma generated in an argon atmosphere, the second microcrystalline semiconductor film 58d with improved flatness as compared to the first microcrystalline semiconductor film 57 was formed, although the thickness thereof was reduced as compared to the first microcrystalline semiconductor film 57.

From the above, it is found that the flatness of a microcrystalline semiconductor film is improved by exposing the microcrystalline semiconductor film to plasma generated in an argon atmosphere.

Example 2

In Example 2, correlation between the existence or absence of a step of removing an amorphous semiconductor region on a surface side of a flattened microcrystalline semiconductor film is performed or not and the crystallinity of the microcrystalline semiconductor film is described with reference to FIGS. 15A to 15C.

As in Example 1, the insulating film 55 was formed over the substrate 51 and the first microcrystalline semiconductor film 57 was formed over the insulating film 55. The substrate at this stage is Sample 1.

Then, the second microcrystalline semiconductor film 58d was formed by exposing the first microcrystalline semiconductor film 57 to plasma generated in an Ar atmosphere. Note that the condition under which the plasma was generated in an Ar atmosphere was similar to that applied to Sample 3 in Example 1, except that the exposure time here was 15 seconds.

After that, a third microcrystalline semiconductor film 60a was formed over the second microcrystalline semiconductor film 58d. The substrate at this stage is Sample 4.

As the third microcrystalline semiconductor film 60a, a 30-nm-thick microcrystalline silicon film was formed by a plasma CVD method. The deposition condition for the third microcrystalline semiconductor film 60a was as follows: a source gas was introduced and stabilized, where the flow rate of silane was 6 sccm and the flow rate of hydrogen was 400 sccm; the pressure in the treatment chamber was 100 Pa; the RF power source frequency was 13.56 MHz; and the power of the RF power source was 15 W. Note that the microcrystalline semiconductor film was deposited in a parallel plate plasma treatment apparatus in which the gap between an upper electrode and a lower electrode was 20 mm. The temperature of the upper electrode was 300° C. and that of the lower electrode was 300° C.

As another sample, a third microcrystalline semiconductor film 60b was formed after the second microcrystalline semiconductor film 58d was exposed to plasma generated in an atmosphere containing hydrogen. The substrate at this stage is Sample 5.

The plasma generated in the atmosphere containing hydrogen was generated under a condition that hydrogen at a flow rate of 4000 sccm was introduced into a treatment chamber of a plasma CVD apparatus, the pressure in the treatment chamber was 1000 Pa, the RF power source frequency was 60 MHz, the power of the RF power source was 300 W, the temperature of the upper electrode and the lower electrode was 300° C., and the gap between the parallel-plate electrodes was 20 mm. The second microcrystalline semiconductor film 58d was exposed to the plasma for 120 seconds.

Then, a 30-nm-thick microcrystalline silicon film was formed as the third microcrystalline semiconductor film 60b under a condition similar to that applied to Sample 4.

Figure 15A:
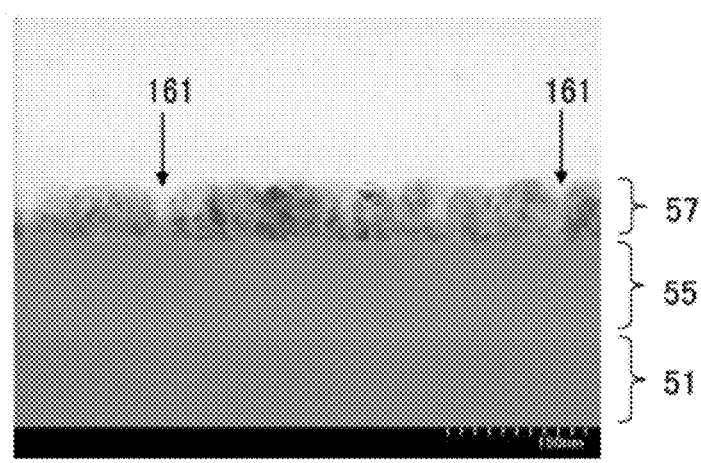
FIGS. 15A to 15C are cross-sectional STEM images of a microcrystalline semiconductor film.
Figure 15B:
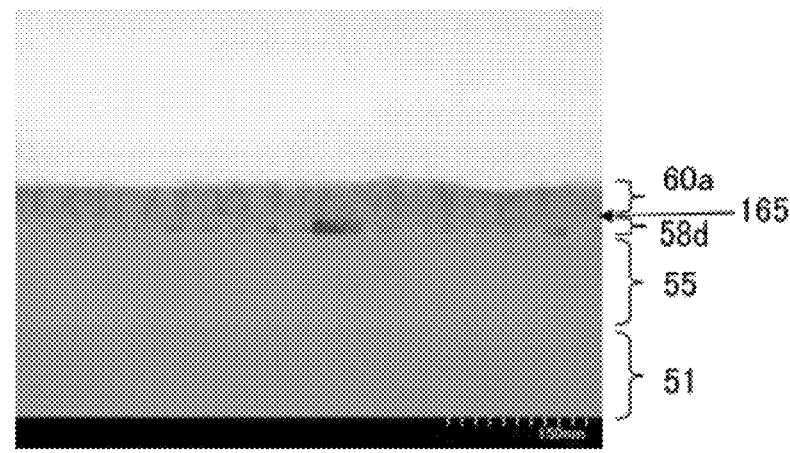
Figure 15C:
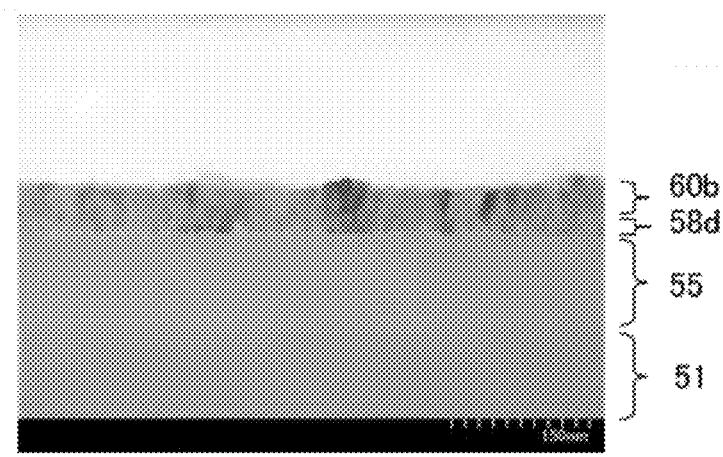

The results of observation of Samples 1, 4, and 5 by STEM are shown in FIGS. 15A to 15C. The magnification was 200000 times. FIG. 15A is a cross-sectional STEM image of Sample 1; FIG. 15B, a cross-sectional STEM image of Sample 4; and FIG. 15C, a cross-sectional STEM image of Sample 5.

As shown in FIG. 15A, the spaces 161 were formed between the crystal grains in Sample 1.

As shown in FIG. 15B, an amorphous semiconductor region 165 was formed between the second microcrystalline semiconductor film 58d and the third microcrystalline semiconductor film 60a in Sample 4. The shades in the second microcrystalline semiconductor film 58d were different from those in the third microcrystalline semiconductor film 60a. From the above, it is found that the crystallinity of the second microcrystalline semiconductor film 58d and that of the third microcrystalline semiconductor film 60a were different and that the third microcrystalline semiconductor film 60a did not grow using the second microcrystalline semiconductor film 58d as a seed crystal.

On the other hand, as shown in FIG. 15C, in the case where the second microcrystalline semiconductor film 58d which was flattened by being exposed to the plasma generated in an argon atmosphere was exposed to the plasma generated in an atmosphere containing hydrogen and then the third microcrystalline semiconductor film 60b was formed thereover, the shades in the third microcrystalline semiconductor film 60b stacked over the second microcrystalline semiconductor film 58d were similar to those in the second microcrystalline semiconductor film 58d. From the above, it was found that the amorphous semiconductor region on a surface side of the second microcrystalline semiconductor film 58d can be removed by exposure to plasma generated in an atmosphere containing hydrogen. It can be also known that the third microcrystalline semiconductor film 60b grew using the second microcrystalline semiconductor film 58d as a seed crystal.

It is found that Sample 5 shown in FIG. 15C is a microcrystalline semiconductor film in which an area occupied by a space between crystal grains is smaller than that in FIG. 15A. In Sample 5 shown in FIG. 15C, it can be observed that a microcrystalline semiconductor film including the crystal grains which grew from the insulating film 55 side toward a surface was formed, which is compared to Sample 4 shown in FIG. 15B. From the above, it is found that a microcrystalline semiconductor film having high crystallinity and high flatness in which an area occupied by a space between crystal grains is small can be formed.

Next, the existence or absence of a space between crystal grains is described with respect to the microcrystalline semiconductor films in Samples 1, 4, and 5. Here, the microcrystalline semiconductor film was inspected for a space between crystal grains with the use of hydrofluoric acid, which dissolves silicon oxide.

In Example 2, the insulating film 55 was formed using a silicon oxide film. In the case where a microcrystalline semiconductor film having high crystallinity and high flatness in which a space between crystal grains is small is formed over the insulating film 55, the microcrystalline semiconductor film serves as a blocking film so that the insulating film 55 of Samples 1, 4, and 5 which are immersed in hydrofluoric acid is not easily diluted by the hydrofluoric acid. On the other hand, if a space is formed between the crystal grains in the microcrystalline semiconductor film, hydrofluoric acid permeates through the space so as to react with the insulating film 55, so that the insulating film 55 is removed and the microcrystalline semiconductor film is separated from the substrate 51. By utilizing the above-described reaction, the microcrystalline semiconductor film can be inspected for a space between crystal grains.

Here, Samples 1, 4, and 5 were immersed in 0.5% hydrofluoric acid for 10 minutes. The state of the microcrystalline semiconductor film is described in Table 1.

TABLE 1

|  | SAMPLE 1 | SAMPLE 4 | SAMPLE 5 |
| --- | --- | --- | --- |
| Measured Result | x | ○ | ○ |

In Table 1, a circle means that the microcrystalline semiconductor film formed over the silicon oxide film was not lifted off; an X mark means that the microcrystalline semiconductor film formed over the silicon oxide film was lifted off. It is found from Table 1 that, when a microcrystalline semiconductor film having a space between crystal grains is exposed to plasma generated in an argon atmosphere, the space between the crystal grains are filled so that the hydrofluoric acid does not permeate and the silicon oxide film is not diluted.

Then, the crystallinity of the microcrystalline semiconductor film of Samples 1, 4, and 5 was analyzed by Raman spectroscopy. Average values of crystalline/amorphous peak intensity ratios (Ic/Ia) of the three samples are shown in Table 2. The Raman spectroscopic analysis was conducted with the use of LabRAM HR-PL manufactured by HORIBA Jobin Yvon.

TABLE 2

|  | SAMPLE 1 | SAMPLE 4 | SAMPLE 5 |
|---|---|---|---|
| Ic/Ia | 6.4 | 3.3 | 6.7 |

It is found that the microcrystalline semiconductor films of Samples 1 and 5 have high crystallinity.

From the results shown in Tables 1 and 2, it is possible to form a microcrystalline semiconductor film having high crystallinity and high flatness in which an area occupied by a space between crystal grains is small in the following manner: a microcrystalline semiconductor film is exposed to plasma generated in an argon atmosphere and then exposed to plasma generated in an atmosphere containing hydrogen, and another microcrystalline semiconductor film is formed thereover.

This application is based on Japanese Patent Application serial no. 2010-045990 filed with Japan Patent Office on Mar. 2, 2010, the entire contents of which are hereby incorporated by reference.

What is claimed is:

1. A method for manufacturing a microcrystalline semiconductor film, comprising:
    mixing a deposition gas containing silicon with hydrogen and applying high-frequency power to form a first microcrystalline semiconductor film over a substrate;
    performing treatment for flattening the first microcrystalline semiconductor film;
    performing treatment for removing a superficial layer of the flattened first microcrystalline semiconductor film; and
    mixing a deposition gas containing silicon with hydrogen and applying high-frequency power to form a second microcrystalline semiconductor film over the first microcrystalline semiconductor film with the superficial layer removed.

2. A method for manufacturing a microcrystalline semiconductor film, comprising:
    mixing a deposition gas containing silicon with hydrogen and applying high-frequency power to form a first microcrystalline semiconductor film over a substrate;
    exposing the first microcrystalline semiconductor film to plasma generated by applying high-frequency power in a rare gas atmosphere;
    exposing the first microcrystalline semiconductor film exposed to the plasma generated by applying the high-frequency power in the rare gas atmosphere to plasma generated by applying high-frequency power in an atmosphere containing hydrogen; and
    mixing a deposition gas containing silicon with hydrogen and applying high-frequency power to form a second microcrystalline semiconductor film over the first microcrystalline semiconductor film after exposing the first microcrystalline semiconductor film exposed to the plasma generated by applying the high-frequency power in the rare gas atmosphere to the plasma generated by applying the high-frequency power in the atmosphere containing hydrogen.

3. A method for manufacturing a microcrystalline semiconductor film, comprising:
    mixing a deposition gas containing silicon with hydrogen and applying high-frequency power to form a first microcrystalline semiconductor film over a substrate;
    exposing the first microcrystalline semiconductor film to plasma generated by applying high-frequency power in a rare gas atmosphere to form a second microcrystalline semiconductor film having an amorphous semiconductor region on a surface side;
    exposing the second microcrystalline semiconductor film to plasma generated by applying high-frequency power in an atmosphere containing hydrogen and removing the amorphous semiconductor region of the second microcrystalline semiconductor film to form a third microcrystalline semiconductor film; and
    mixing a deposition gas containing silicon with hydrogen and applying high-frequency power to form a fourth microcrystalline semiconductor film over the third microcrystalline semiconductor film.

4. A method for manufacturing a semiconductor device, comprising:
    forming a gate electrode over a substrate;
    forming a gate insulating film over the substrate and the gate electrode;
    mixing a deposition gas containing silicon with hydrogen and applying high-frequency power to form a first microcrystalline semiconductor film over the gate insulating film;
    performing treatment for flattening the first microcrystalline semiconductor film;
    performing treatment for removing a superficial layer of the flattened first microcrystalline semiconductor film;
    mixing a deposition gas containing silicon with hydrogen and applying high-frequency power to form a second microcrystalline semiconductor film over the first microcrystalline semiconductor film with the superficial layer removed;
    forming a semiconductor film including a microcrystalline semiconductor region and an amorphous semiconductor region, over the second microcrystalline semiconductor film;
    forming a first impurity semiconductor film over the semiconductor film;
    etching a part of the first impurity semiconductor film to form a second impurity semiconductor film;
    etching a part of the first microcrystalline semiconductor film, a part of the second microcrystalline semiconductor film, and a part of the semiconductor film to form a first semiconductor stack;
    forming wirings functioning as a source electrode and a drain electrode over the second impurity semiconductor film; and
    etching the second impurity semiconductor film to form a pair of impurity semiconductor films functioning as a source region and a drain region.

5. The method for manufacturing a semiconductor device according to claim 4, further comprising:
    exposing a side surface of the first semiconductor stack to plasma to form an insulating region on a side wall of the first semiconductor stack after formation of the first semiconductor stack and before formation of the wirings functioning as the source electrode and the drain electrode over the first semiconductor stack.

6. The method for manufacturing a semiconductor device according to claim 4,
    wherein the treatment for flattening the first microcrystalline semiconductor film is treatment for exposing the first microcrystalline semiconductor film to plasma generated by applying high-frequency power in a rare gas atmosphere; and wherein the treatment for removing the superficial layer of the flattened first microcrystalline semiconductor film is treatment for exposing a surface of the first microcrystalline semiconductor film to plasma generated by applying high-frequency power in an atmosphere containing hydrogen.

7. The method for manufacturing a semiconductor device according to claim 4, comprising:
   etching a part of the first semiconductor stack to form a second semiconductor stack including a microcrystalline semiconductor region and a pair of amorphous semiconductor regions;
   forming an insulating film over the wirings, the pair of impurity semiconductor films, the second semiconductor stack, and the gate insulating film; and
   forming a back-gate electrode over the insulating film.

8. The method for manufacturing the semiconductor device according to claim 7, wherein a top surface shape of the gate electrode is parallel to a top surface shape of the back-gate electrode in a longitudinal direction.

9. The method for manufacturing the semiconductor device according to claim 7, wherein the gate electrode is connected to the back-gate electrode.

10. The method for manufacturing the semiconductor device according to claim 7, wherein the back-gate electrode is electrically in a floating state.

11. A method for manufacturing a photoelectric conversion device, comprising:
    forming a first electrode over a substrate;
    forming a semiconductor film having a first conductivity type over the first electrode;
    forming a semiconductor film having a function of photoelectric conversion over the semiconductor film having the first conductivity type;
    forming a semiconductor film having a second conductivity type over the semiconductor film having the function of photoelectric conversion; and
    forming a second electrode over the semiconductor film having the second conductivity type,
    wherein at least one of the semiconductor film having the first conductivity type, the semiconductor film having the function of photoelectric conversion, and the semiconductor film having the second conductivity type is formed by a method comprising:
      mixing a deposition gas containing silicon with hydrogen and applying high-frequency power to form a first microcrystalline semiconductor film;
      performing treatment for flattening the first microcrystalline semiconductor film;
      performing treatment for removing a superficial layer of the flattened first microcrystalline semiconductor film; and
      mixing a deposition gas containing silicon with hydrogen and applying high-frequency power to form a second microcrystalline semiconductor film over the first microcrystalline semiconductor film with the superficial layer removed.

12. The method for manufacturing the semiconductor device according to claim 11,
    wherein the treatment for flattening the first microcrystalline semiconductor film is treatment for exposing the first microcrystalline semiconductor film to plasma generated by applying high-frequency power in a rare gas atmosphere, and
    wherein the treatment for removing the superficial layer of the flattened first microcrystalline semiconductor film is treatment for exposing a surface of the first microcrystalline semiconductor film to plasma generated by applying high-frequency power in an atmosphere containing hydrogen.

* * * * *